(12) United States Patent
Yamamoto et al.

(10) Patent No.: US 10,455,345 B2
(45) Date of Patent: *Oct. 22, 2019

(54) SOUND PROCESSING APPARATUS AND SOUND PROCESSING SYSTEM

(71) Applicant: Sony Corporation, Tokyo (JP)

(72) Inventors: Yuki Yamamoto, Tokyo (JP); Toru Chinen, Kanagawa (JP); Runyu Shi, Tokyo (JP); Mitsuyuki Hatanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/932,368

(22) Filed: Feb. 16, 2018

(65) Prior Publication Data

US 2018/0184222 A1 Jun. 28, 2018

Related U.S. Application Data

(63) Continuation of application No. 14/785,416, filed as application No. PCT/JP2014/060460 on Apr. 11, 2014.

(51) Int. Cl.
*H03G 3/00* (2006.01)
*H04S 5/00* (2006.01)
*H03G 3/30* (2006.01)

(52) U.S. Cl.
CPC ........... *H04S 5/005* (2013.01); *H03G 3/3005* (2013.01); *H04S 2400/11* (2013.01); *H04S 2400/13* (2013.01)

(58) Field of Classification Search
CPC .. H04S 5/005; H04S 2400/11; H04S 2400/13; H03G 3/3005
See application file for complete search history.

(56) References Cited

U.S. PATENT DOCUMENTS 8,204,615 B2 6/2012 Yamada et al.
8,472,653 B2 6/2013 Kon
(Continued)

FOREIGN PATENT DOCUMENTS

CN 102694517 A 9/2012
CN 102711032 A 10/2012
(Continued)

OTHER PUBLICATIONS

Rocchesso, Davide, "Audio effects to enhance spatial information displays", 2002, IEEE, p. 3 and 4.*
(Continued)

*Primary Examiner* — Sonia L Gay
(74) *Attorney, Agent, or Firm* — Wolf, Greenfield & Sacks, P.C.

(57) ABSTRACT

The present technology relates to a sound processing apparatus and a sound processing system for enabling more stable localization of a sound image.

A virtual speaker is assumed to exist on the lower side among the sides of a tetragon having its corners formed with four speakers surrounding a target sound image position on a spherical plane. Three-dimensional VBAP is performed with respect to the virtual speaker and the two speakers located at the upper right and the upper left, to calculate gains of the two speakers at the upper right and the upper left and the virtual speaker, the gains being to be used for fixing a sound image at the target sound image position. Further, two-dimensional VBAP is performed with respect to the lower right and lower left speakers, to calculate gains of the lower right and lower left speakers, the gains being to be used for fixing a sound image at the position of the virtual speaker. The values obtained by multiplying these gains by the gain of the virtual speaker are set as the gains of the lower right and lower left speakers for fixing a sound image (Continued)

at the target sound image position. The present technology can be applied to sound processing apparatuses.

7 Claims, 16 Drawing Sheets

(56) References Cited

U.S. PATENT DOCUMENTS

| | | | |
|---|---|---|---|
| 8,503,682 | B2 | 8/2013 | Fukui et al. |
| 8,520,857 | B2 | 8/2013 | Fukui et al. |
| 8,831,231 | B2 | 9/2014 | Fukui et al. |
| 8,873,761 | B2 | 10/2014 | Fukui et al. |
| 9,681,249 | B2 | 6/2017 | Yamamoto et al. |
| 9,998,845 | B2 | 6/2018 | Shi et al. |
| 10,171,926 | B2 | 1/2019 | Yamamoto et al. |
| 10,225,677 | B2 | 3/2019 | Yamamoto et al. |
| 2009/0043411 | A1 | 2/2009 | Yamada et al. |
| 2009/0208022 | A1 | 8/2009 | Fukui et al. |
| 2009/0214045 | A1 | 8/2009 | Fukui et al. |
| 2010/0053210 | A1 | 3/2010 | Kon |
| 2010/0272270 | A1 | 10/2010 | Chaikin et al. |
| 2010/0322428 | A1 | 12/2010 | Fukui et al. |
| 2011/0182436 | A1* | 7/2011 | Murgia ............... H04R 3/005 381/71.1 |
| 2011/0286601 | A1 | 11/2011 | Fukui et al. |
| 2011/0305358 | A1 | 12/2011 | Nishio et al. |
| 2012/0008789 | A1 | 1/2012 | Kim et al. |
| 2012/0070021 | A1 | 3/2012 | Yoo et al. |
| 2012/0237062 | A1 | 9/2012 | Korn |
| 2013/0010971 | A1 | 1/2013 | Batke et al. |
| 2013/0287235 | A1 | 10/2013 | Fukui et al. |
| 2013/0329922 | A1* | 12/2013 | Lemieux ............... H04S 7/30 381/307 |
| 2014/0119581 | A1 | 5/2014 | Tsingos et al. |
| 2014/0205111 | A1 | 7/2014 | Hatanaka et al. |
| 2014/0219456 | A1* | 8/2014 | Morrell ............... H04S 5/00 381/17 |
| 2015/0294672 | A1 | 10/2015 | Batke et al. |
| 2016/0037280 | A1 | 2/2016 | Tsingos et al. |
| 2016/0073213 | A1 | 3/2016 | Yamamoto et al. |
| 2016/0080883 | A1 | 3/2016 | Yamamoto et al. |
| 2016/0165374 | A1 | 6/2016 | Shi et al. |
| 2017/0025127 | A1 | 1/2017 | Batke et al. |
| 2017/0245086 | A1 | 8/2017 | Yamamoto et al. |
| 2019/0149935 | A1 | 5/2019 | Yamamoto et al. |

FOREIGN PATENT DOCUMENTS

| | | |
|---|---|---|
| CN | 102823277 A | 12/2012 |
| CN | 105122846 A | 12/2015 |
| JP | 2007-329746 A | 12/2007 |
| JP | 2008/017117 A | 1/2008 |
| JP | 2009-038641 A | 2/2009 |
| JP | 2010-041190 A | 2/2010 |
| JP | 2013/510481 A | 3/2013 |
| KR | 20100084332 A | 7/2010 |
| WO | 2011/054876 A1 | 5/2011 |
| WO | WO 2011/117399 A1 | 9/2011 |
| WO | WO 2013/006330 A2 | 1/2013 |

OTHER PUBLICATIONS

U.S. Appl. No. 12/221,527, filed Aug. 4, 2008, Yamada et al.
U.S. Appl. No. 12/366,056, filed Feb. 5, 2009, Fukui et al.
U.S. Appl. No. 12/366,095, filed Feb. 5, 2009, Fukui et al.
U.S. Appl. No. 12/545,956, filed Aug. 24, 2009, Kon.
U.S. Appl. No. 12/815,729, filed Jun. 15, 2010, Fukui et al.
U.S. Appl. No. 13/104,614, filed May 10, 2011, Fukui et al.
U.S. Appl. No. 13/154,906, filed Jun. 7, 2011, Nishio et al.
U.S. Appl. No. 13/927,983, filed Jun. 26, 2013, Fukui et al.
U.S. Appl. No. 14/239,797, filed Feb. 20, 2014, Hatanaka et al.
U.S. Appl. No. 14/785,416, filed Oct. 19, 2015, Yamamoto et al.
U.S. Appl. No. 14/785,497, filed Oct. 19, 2015, Yamamoto et al.
U.S. Appl. No. 14/905,116, filed Jan. 14, 2016, Shi et al.
U.S. Appl. No. 15/591,471, filed May 10, 2017, Yamamoto et al.
PULKKI, Virtual Sound Source Positioning Using Vector Base Amplitue Panning*. J.Audio Eng. Soc., 1997;45(6):456-66.
Japanese Office Action dated Nov. 20, 2018 in connection with Japanese Application No. 2015-513675 and English translation thereof.
Japanese Office Action dated May 8, 2018 in connection with Japanese Application No. 2015-513675 and English translation thereof.
Japanese Office Action dated May 8, 2018 in connection with Japanese Application No. 2015-513676 and English translation thereof.
International Search Report and Written Opinion and English translation thereof dated May 13, 2014 in connection with International Application No. PCT/JP2014/060460.
International Preliminary Report on Patentability and English Translation thereof dated Nov. 5, 2015 in connection with International Application No. PCT/JP2014/060460.
International Search Report and Written Opinion and English translation thereof dated May 13, 2014 in connection with International Application No. PCT/JP2014/060459.
International Preliminary Report on Patentability and English Translation thereof dated Nov. 5, 2015 in connection with International Application No. PCT/JP2014/060459.
European Search Report dated Nov. 15, 2016 in connection with European Application No. EP14788782.2.
European Search Report dated Nov. 16, 2016 in connection with European Application No. EP14789040.4.
Chinese Office Action dated Sep. 28, 2016 in connection with Chinese Application No. 201480022318.8, and English translation thereof.
Chinese Office Action dated Nov. 30, 2016 in connection with Chinese Application No. 201480022270.0, and English translation thereof.
Chinese Office Action dated Mar. 27, 2017 in connection with Chinese Application No. 201480022318.8, and English translation thereof.
U.S. Appl. No. 16/248,739, filed Jan. 15, 2019, Yamamoto et al.
Japanese Office Action dated Jul. 23, 2019 in connection with Japanese Application No. 2018-148194, and English translation thereof.

* cited by examiner

SOUND PROCESSING APPARATUS AND SOUND PROCESSING SYSTEM

CROSS REFERENCE TO RELATED APPLICATIONS

This application is a continuation, and claims the benefit under 35 U.S.C. § 120, of U.S. patent application Ser. No. 14/785,416, titled "SOUND PROCESSING APPARATUS AND SOUND PROCESSING SYSTEM," filed on Oct. 19, 2015, which is a U.S. National Stage Entry, under 35 U.S.C. § 371, of International Application No. PCT/JP2014/060460, filed in the Japanese Patent Office as a Receiving Office on Apr. 11, 2014, which claims priority to Japanese Patent Application Number JP 2013-094269, filed in the Japanese Patent Office on Apr. 26, 2013. Each of these applications is hereby incorporated by reference in its entirety.

TECHNICAL FIELD

The present technology relates to sound processing apparatuses and sound processing systems, and more particularly, to a sound processing apparatus and a sound processing system for enabling more stable localization of a sound image.

BACKGROUND ART

As a technique for controlling localization of a sound image using speakers, VBAP (Vector Base Amplitude Panning) has been known (see Non-Patent Document 1, for example).

By VBAP, a target localization position of a sound image is expressed by a linear sum of vectors extending toward two or three speakers located around the localization position. The coefficients by which the respective vectors are multiplied in the linear sum are used as the gains of the sounds to be output from the respective speakers, and gain adjustment is performed so that a sound image is fixed at the target position.

CITATION LIST

Non-Patent Document

Non-Patent Document 1: Ville Pulkki, "Virtual Sound Source Positioning Using Vector Base Amplitude Panning", Journal of AES, vol. 45, no. 6, pp. 456-466, 1997

SUMMARY OF THE INVENTION

Problems to be Solved by the Invention

By the above described technique, however, a sound image can be fixed at a target position, but localization of the sound image might become unstable depending on the localization position of the sound image.

By three-dimensional VBAP for performing VBAP using three speakers, there are cases where only two speakers among the three speakers output sound, and the remaining one speaker is controlled not to output sound depending on the target localization position of a sound image.

In such a case, when the user moves while listening to sound, the sound image might move in a different direction from the direction of the movement, and the user might feel that localization of the sound image is unstable. If localization of the sound image becomes unstable, the range of the sweet spot as an optimum listening position becomes narrower.

The present technology has been developed in view of those circumstances, and is to enable more stable localization of a sound image.

Solutions to Problems

A sound processing apparatus according to one aspect of the present technology includes: four or more sound outputting units; a gain calculating unit that determines output gains of sounds to be output from the four or more sound outputting units located close to a sound image localization position as a target position by calculating gains of sounds to be output from the sound outputting units based on a positional relationship between the sound outputting units with respect to each of different combinations among combinations of two or three of the four or more sound outputting units, the output gains being to be used for fixing a sound image at the sound image localization position; and a gain adjusting unit that performs gain adjustment on sounds to be output from the sound outputting units based on the output gains.

At least four of the output gains each have a value other than 0.

The gain calculating unit may include: a first gain calculating unit that calculates output gains of a virtual sound outputting unit and two of the sound outputting units based on a positional relationship among the virtual sound outputting unit, the two of the sound outputting units, and the sound image localization position; a second gain calculating unit that calculates gains of other two of the sound outputting units than the two of the sound outputting units based on a positional relationship among the other two of the sound outputting units and the virtual sound outputting unit, the gains of the other two of the sound outputting units being to be used for fixing a sound image at a position of the virtual sound outputting unit; and a calculating unit that calculates output gains of the other two of the sound outputting units based on the gains of the other two of the sound outputting units and the output gain of the virtual sound outputting unit.

The calculating unit may calculate the output gains of the other two of the sound outputting units by multiplying the gains of the other two of the sound outputting units by the output gain of the virtual sound outputting unit.

The position of the virtual sound outputting unit may be set on a side of a polygon having the four or more sound outputting units at the corners thereof.

The gain calculating unit may include: a virtual gain calculating unit that calculates output gains of three of the sound outputting units based on a positional relationship among the three of the sound outputting units and the sound image localization position; and a calculating unit that calculates ultimate output gains of the sound outputting units based on the output gains calculated by the virtual gain calculating unit calculating the output gains with respect to different combinations among the combinations.

The calculating unit may calculate an ultimate output gain of the same one of the sound outputting units by determining a sum of the output gains determined with respect to the same one of the sound outputting units.

A sound processing system according to one aspect of the present technology includes: four or more sound outputting units; a gain calculating unit that determines output gains of sounds to be output from at the four or more sound outputting units located close to a sound image localization position as a target position by calculating gains of sounds to be output from the sound outputting units based on a positional relationship between the sound outputting units with respect to each of different combinations among combinations of two or three of the four or more sound outputting units, the output gains being to be used for fixing a sound image at the sound image localization position; and a gain adjusting unit that performs gain adjustment on sounds to be output from the sound outputting units based on the output gains.

In one aspect of the present technology, output gains of sounds to be output from at four or more sound outputting units located close to a sound image localization position as a target position are determined by calculating gains of sounds to be output from the sound outputting units based on a positional relationship between the sound outputting units with respect to each of different combinations among combinations of two or three of the four or more sound outputting units, the output gains being to be used for fixing a sound image at the sound image localization position; and gain adjustment is performed on sounds to be output from the sound outputting units based on the output gains.

Effects of the Invention

According to one aspect of the present technology, a sound image can be fixed in a more stable manner.

MODES FOR CARRYING OUT THE INVENTION

Figure 1:
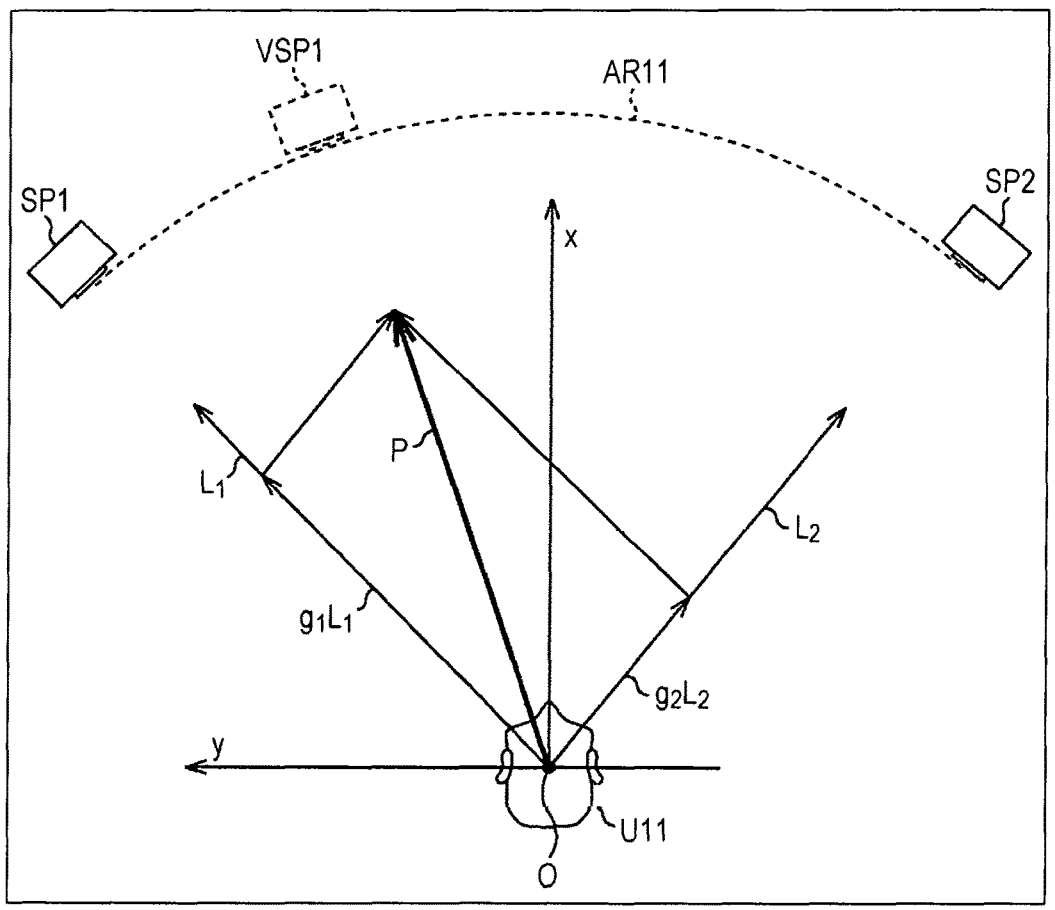
FIG. 1 is a diagram for explaining two-dimensional VBAP.

The following is a description of embodiments to which the present technology is applied, with reference to the drawings.

<First Embodiment>
<Outline of the Present Technology>

Referring now to FIGS. 1 through 8, an outline of the present technology is described. In FIGS. 1 through 8, like components are denoted by like reference numerals, and explanation of them will not be unnecessarily repeated.

As shown in FIG. 1, a user U11 who is to view or listen to content such as a moving image accompanied by sound or a music piece is listening to the sound of two channels being output from two speakers SP1 and SP2 as the sound of content, for example.

In this case, it is possible to fix a sound image at the position of a virtual sound source VSP1, using position information about the two speakers SP1 and SP2 outputting the sound of the respective channels.

For example, with the position of the head of the user U11 being the origin O, the position of the virtual sound source VSP1 in a two-dimensional coordinate system having the vertical direction and the horizontal direction as the x-axis direction and the y-axis direction is represented by a vector P having the origin O as its starting point in the drawing.

Since the vector P is a two-dimensional vector, the vector P can be represented by a linear sum of a vector $L_1$ and a vector $L_2$ extending in the directions of the speaker SP1 and the speaker SP2, respectively, with the origin O being the starting point. That is, the vector P can be expressed by the following equation (1) using the vector $L_1$ and the vector $L_2$:

[Mathematical Formula 1]

$$P = g_1 L_1 + g_2 L_2 \tag{1}$$

The coefficient $g_1$ and the coefficient $g_2$ by which the vector $L_1$ and the vector $L_2$ are multiplied in the equation (1) are calculated. With these coefficients $g_1$ and $g_2$ being the gains of sounds that are output from the speakers SP1 and SP2, respectively, a sound image can be fixed at the position of the virtual sound source VSP1. That is, a sound image can be fixed at the position indicated by the vector P.

The method of controlling the localization position of a sound image by calculating the coefficients $g_1$ and $g_2$ from the position information about the two speakers SP1 and SP2 is called two-dimensional VBAP.

In the example shown in FIG. 1, a sound image can be fixed at any position on an arc AR11 connecting the speaker SP1 and the speaker SP2. Here, the arc AR11 is part of a circle that passes through the respective positions of the speaker SP1 and the speaker SP2, with the origin O being the center.

Since the vector P is a two-dimensional vector, if the angle between the vector $L_1$ and the vector $L_2$ is greater than 0 degrees but smaller than 180 degrees, the coefficients $g_1$ and $g_2$ to be the gains are uniquely determined. The method of calculating these coefficients $g_1$ and $g_2$ is described in detail in the above described Non-Patent Document 1.

Figure 2:
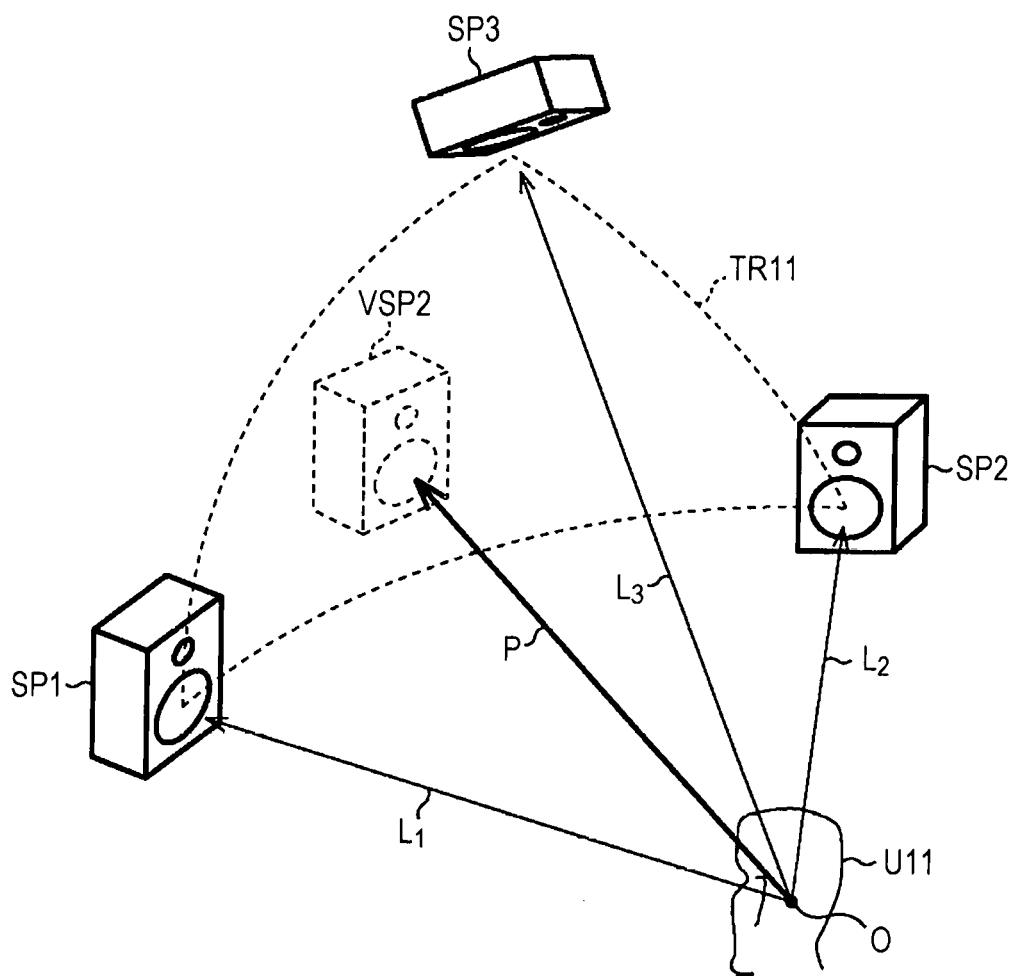
FIG. 2 is a diagram for explaining three-dimensional VBAP.

In a case where sounds of three channels are to be reproduced, however, the number of speakers that output sounds is three as shown in FIG. 2, for example.

In the example shown in FIG. 2, sounds of the respective channels are output from three speakers SP1, SP2, and SP3.

In such a case, the concept is the same as the above described two-dimensional VBAP, except that the number of gains of sounds of the respective channels to be output from the speakers SP1 through SP3, or the number of the coefficients to be calculated as the gains, is three.

Specifically, in a case where a sound image is to be fixed at the position of a virtual sound source VSP2, the position of the virtual sound source VSP2 is represented by a three-dimensional vector P having an origin O as its starting point in a three-dimensional coordinate system in which the position of the head of the user U11 is the origin O.

Where the three-dimensional vectors extending in the directions from the origin O as the starting point toward the respective positions of the speakers SP1 through SP3 are vectors $L_1$ through $L_3$, the vector P can be expressed by a linear sum of the vectors $L_1$ through $L_3$ as shown in the following equation (2):

[Mathematical Formula 2]

$$P = g_1 L_1 + g_2 L_2 + g_3 L_3 \quad (2)$$

The coefficient $g_1$ through $g_3$ by which the vector $L_1$ through $L_3$ are multiplied in the equation (2) are calculated. With these coefficients $g_1$ through $g_3$ being the gains of sounds that are output from the speakers SP1 through SP3, respectively, a sound image can be fixed at the position of the virtual sound source VSP2.

The method of controlling the localization position of a sound image by calculating the coefficients $g_1$ through $g_3$ from the position information about the three speakers SP1 through SP3 is called three-dimensional VBAP.

In the example shown in FIG. 2, a sound image can be fixed at any position within a triangular area TR11 on a spherical plane including the positions of the speaker SP1, the speaker SP2, and the speaker SP3. Here, the area TR11 is an area that is on the plane of a sphere, has the origin O as its center, and includes the respective positions of the speakers SP1 through SP3, and is a triangular area on a spherical plane surrounded by the speakers SP1 through SP3.

With such three-dimensional VBAP, a sound image can be fixed at any position in a space.

Figure 3:
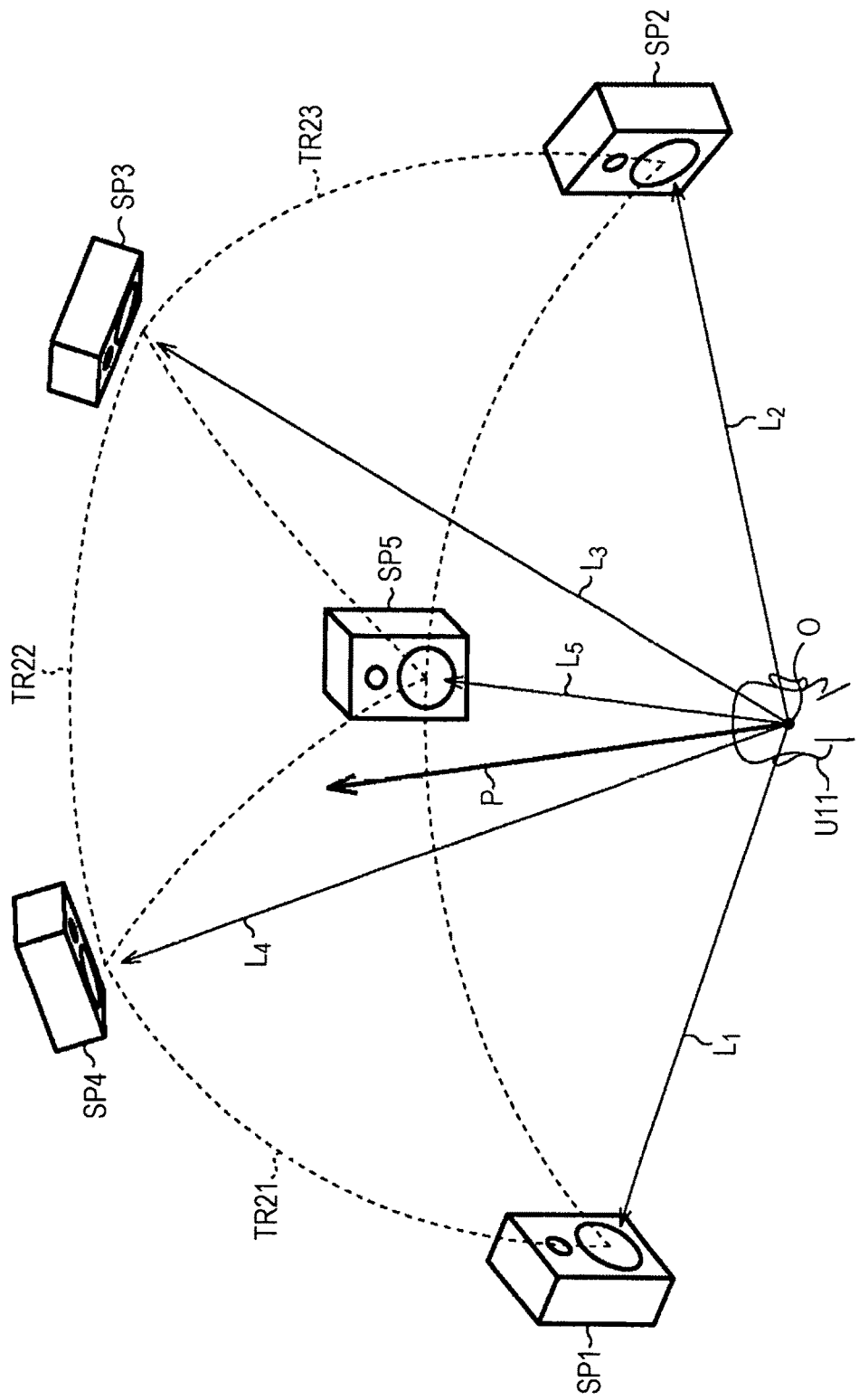
FIG. 3 is a diagram for explaining speaker arrangement.

As shown in FIG. 3, the number of speakers that output sounds is increased, and areas each equivalent to the triangular area TR11 shown in FIG. 2 are provided in a space so that a sound image can be fixed at any position in those areas, for example.

In the example shown in FIG. 3, five speakers SP1 through SP5 are provided, and the speakers SP1 through SP5 output sounds of respective channels. Here, the speakers SP1 through SP5 are provided on a spherical plane that has its center at an origin O located at the head of the user U11.

In this case, three-dimensional vectors extending in the directions from the origin O toward the respective positions of the speakers SP1 through SP5 are vectors $L_1$ through $L_5$, and the same calculation as the above described calculation according to equation (2) is performed, to determine the gains of sounds that are output from the respective speakers.

Here, of the areas on the spherical plane having its center at the origin O, the triangular area surrounded by the speakers SP1, SP4, and SP5 is an area TR21. Likewise, of the areas on the spherical plane having its center at the origin O, the triangular area surrounded by the speakers SP3, SP4, and SP5 is an area TR22, and the triangular area surrounded by the speakers SP2, SP3, and SP5 is an area TR23.

Each of those areas TR21 through TR23 is an area equivalent to the area TR11 shown in FIG. 2. Where the three-dimensional vector indicating the position at which a sound image is to be fixed is a vector P, the vector P indicates a position in the area TR21 in the example shown in FIG. 3.

Therefore, in this example, the same calculation as the calculation according to the equation (2) is performed with the vectors $L_1$, $L_4$, and $L_5$ indicating the positions of the speakers SP1, SP4, and SP5, and the gains of sounds that are output from the respective speakers SP1, SP4, and SP5 are calculated. In this cases, the gains of sounds that are output from the other speakers SP2 and SP3 are 0. That is, no sound is output from these speakers SP2 and SP3.

With the five speakers SP1 through SP5 being provided in a space in this manner, a sound image can be fixed at any position in an area formed with the areas TR21 through TR23.

Figure 4:
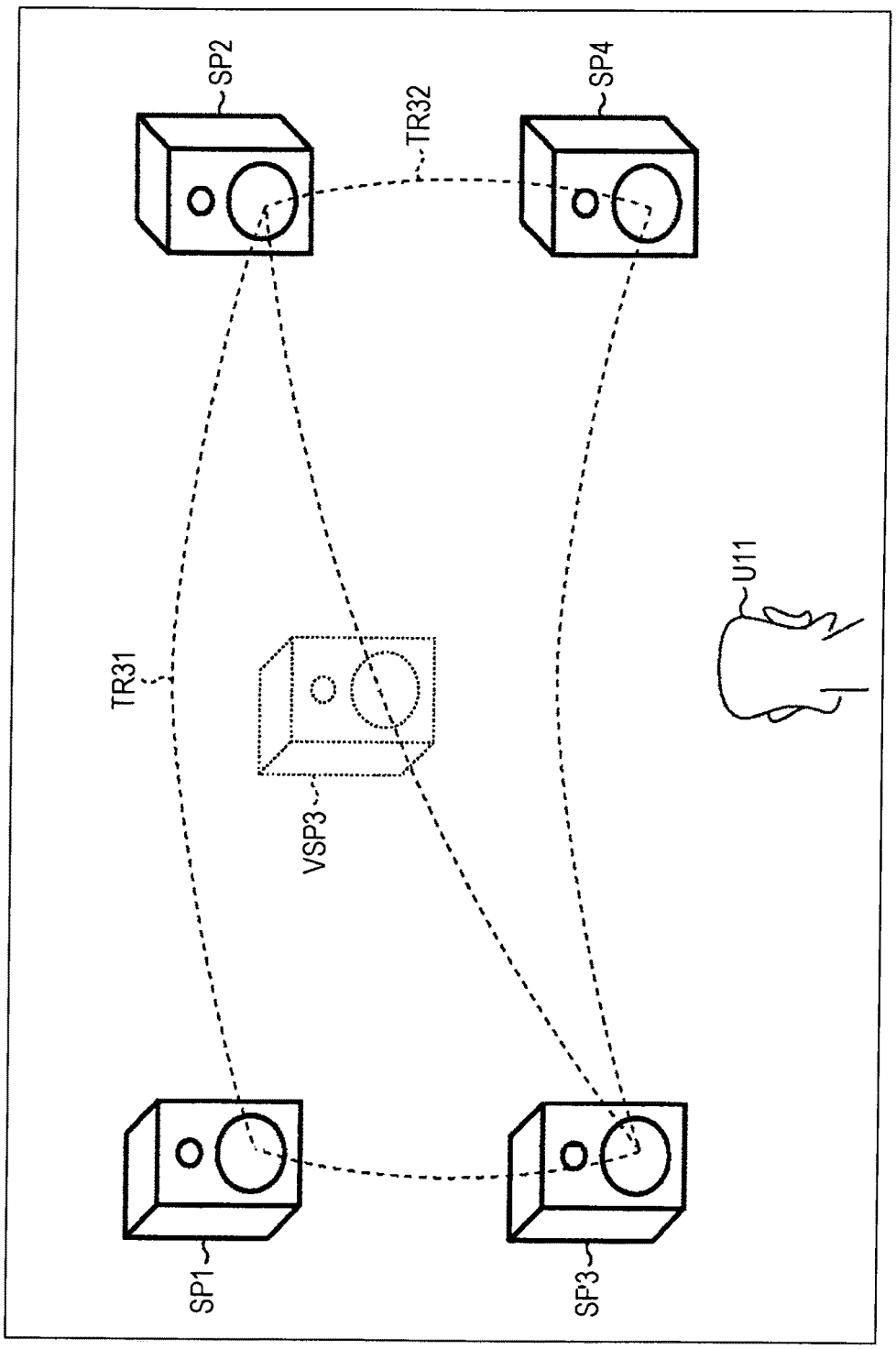
FIG. 4 is a diagram for explaining a gain calculation method to be used in a case where four speakers are provided.

As shown in FIG. 4, four speakers SP1 through SP4 might be provided in a space, and a sound image is to be fixed at the position of a virtual sound source VSP3 located at the center position among these speakers SP1 through SP4.

In the example shown in FIG. 4, the speakers SP1 through SP4 are provided on the plane of a sphere having its center at an origin O (not shown), and the triangular area that is an area on the plane and is surrounded by the speakers SP1 through SP3 is an area TR31. Of the areas on the spherical plane having its center at the origin O, the triangular area surrounded by the speakers SP2 through SP4 is an area TR32.

The virtual sound source VSP3 is located on the lower right side of the area TR31. The virtual sound source VSP3 is also located on the upper left side of the area TR32.

Accordingly, in this case, three-dimensional VBAP should be performed with respect to the speakers SP1 through SP3, or three-dimensional VBAP should be performed with respect to the speakers SP2 through SP4. In either case, the same three-dimensional VBAP calculation result is obtained, and gains are determined so that only the two speakers SP2 and SP3 output sound, and the remaining speakers SP1 and SP4 do not output any sound.

By three-dimensional VBAP, in a case where the position at which a sound image is to be fixed is on the boundary line between triangular areas on a spherical plane connecting three speakers or on a side of a triangle on the spherical plane, only the two speakers located at the two ends of the side output sound.

Figure 5:
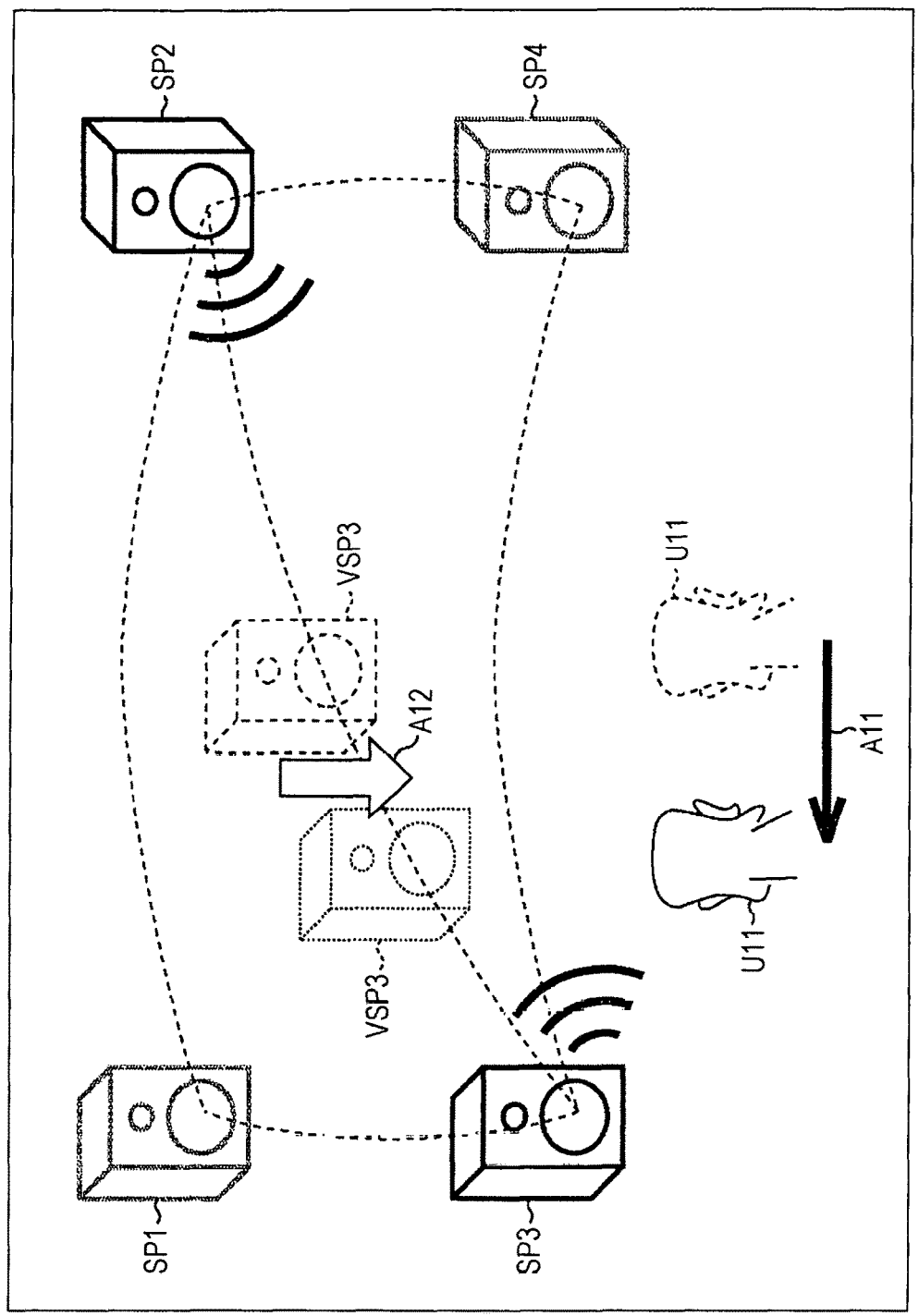
FIG. 5 is a diagram for explaining movement of a sound image.

In a case where only the two speakers SP2 and SP3 output sound as above, the user U11 situated in a sweet spot that is an optimum listening spot might move toward the left in the drawing as indicated by an arrow A11, for example, as shown in FIG. 5.

As a result, the head of the user U11 becomes closer to the speaker SP3, and the sound being output from the speaker SP3 becomes louder to the user U11. Therefore, the user U11 feels like the virtual sound source VSP3, or the sound image, has moved to the lower left as indicated by an arrow A12 in the drawing.

By three-dimensional VBAP, in a case where only two speakers output sound as shown in FIG. 5, if the user U11 moves away from the sweet spot only a short distance, the sound image moves in a direction perpendicular to the movement of the user U11. In such a case, the user U11 feels like the sound image has moved in a different direction from the direction of his/her movement, and therefore, has a feeling of strangeness. That is, the user U11 feels that the localization position of the sound image is unstable, and the sweet spot range becomes narrower.

In view of this, according to the present technology as opposed to the above described VBAP, a larger number of speakers than three, or four or more speakers, are made to output sound so that the localization position of a sound image becomes more stable, and the sweet spot range becomes wider accordingly.

Although the number of speakers that are made to output sound may be any number equal to or larger than four, explanation of an example case where four speakers are made to output sound is continued in the description below.

A sound image is to be fixed at the position of a virtual sound source VSP3 at the center position among four speakers SP1 through SP4, for example, as in the example shown in FIG. 4.

According to the present technology, two or three speakers are selected as a combination in such a case, and VBAP is performed with respect to different combinations of speakers, to calculate the gains of sounds that are output from the four speakers SP1 through SP4.

Figure 6:
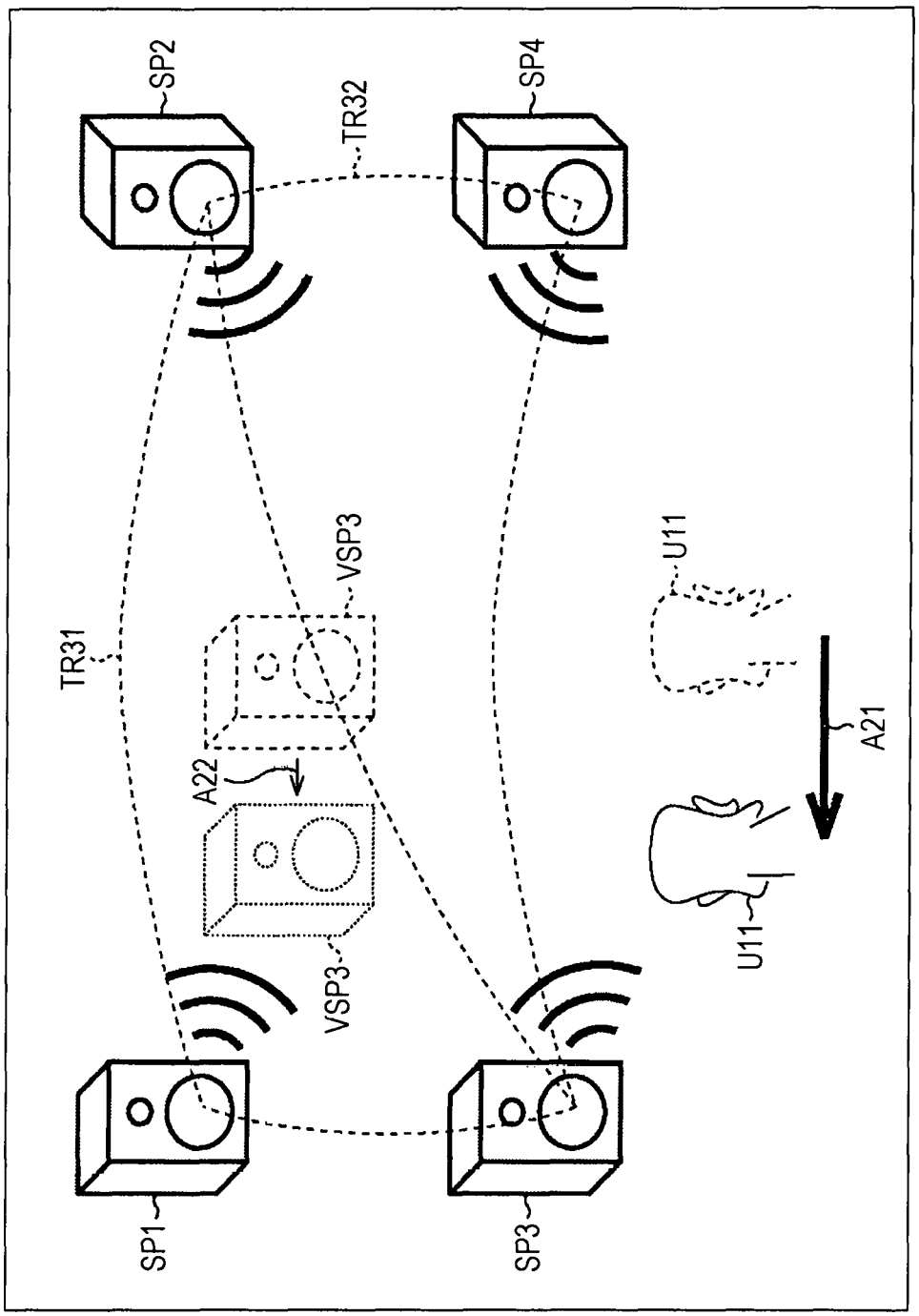
FIG. 6 is a diagram for explaining movement of a sound image in a case where the present technology is applied.

Accordingly, according to the present technology, all the four speakers SP1 through SP4 output sound as shown in FIG. 6, for example.

In such a case, if a user U11 moves to the left from the sweet spot as shown in an arrow A21 in FIG. 6, the position of the virtual sound source VSP3 or the localization position of the sound image only moves to the left as shown in an arrow A22 in the drawing. That is, the sound image does not move downward or in a direction perpendicular to the direction of movement of the user U11 as in the example shown in FIG. 5, but moves only in the same direction as the direction of movement of the user U11.

This is because, when the user U11 moves to the left, the user U11 becomes closer to the speaker SP3, but the speaker SP1 also exists above the speaker SP3. In this case, sound reaches the ears of the user U11 from the upper left and the lower left relative to the user U11, and therefore, the user U11 hardly feels that the sound image has moved downward.

Accordingly, the localization position of the sound image can be made more stable than by a conventional VBAP technique, and as a result, the sweet spot range can be made wider.

Next, the control on localization of sound according to the present technology is described in greater detail.

In the present technique, a vector that indicates a position at which a sound image is to be fixed is a vector P that has its starting point at the origin O (not shown) of a three-dimensional coordinate system, and the vector P is expressed by the following equation (3):

[Mathematical Formula 3]

$$P = g_1 L_1 + g_2 L_2 + g_3 L_3 + g_4 L_4 \quad (3)$$

In the equation (3), the vectors $L_1$ through $L_4$ indicate three-dimensional vectors extending toward the positions of speakers SP1 through SP4 that are located in the vicinity of the localization position of the sound image and are arranged to surround the localization position of the sound image. Also, in the equation (3), $g_1$ through $g_4$ represent the coefficients that are to be calculated as the gains of sounds of the respective channels to be output from the speakers SP1 through SP4.

In the equation (3), the vector P is expressed as a linear sum of the four vectors $L_1$ through $L_4$. Since the vector P is a three-dimensional vector, the four coefficients $g_1$ through $g_4$ are not uniquely determined.

Therefore, according to the present technology, the respective coefficients $g_1$, through $g_4$ to be gains are calculated by the method described below.

A sound image is to be fixed at the center position of a tetragon on a spherical plane surrounded by the four speakers SP1 through SP4 shown in FIG. 4, or at the position of the virtual sound source VSP3.

First, one of the tetragon on the spherical plane having the speakers SP1 through SP4 as the corners is selected, and a virtual speaker (hereinafter referred to as "the virtual speaker") is assumed to exist on the side.

Figure 7:
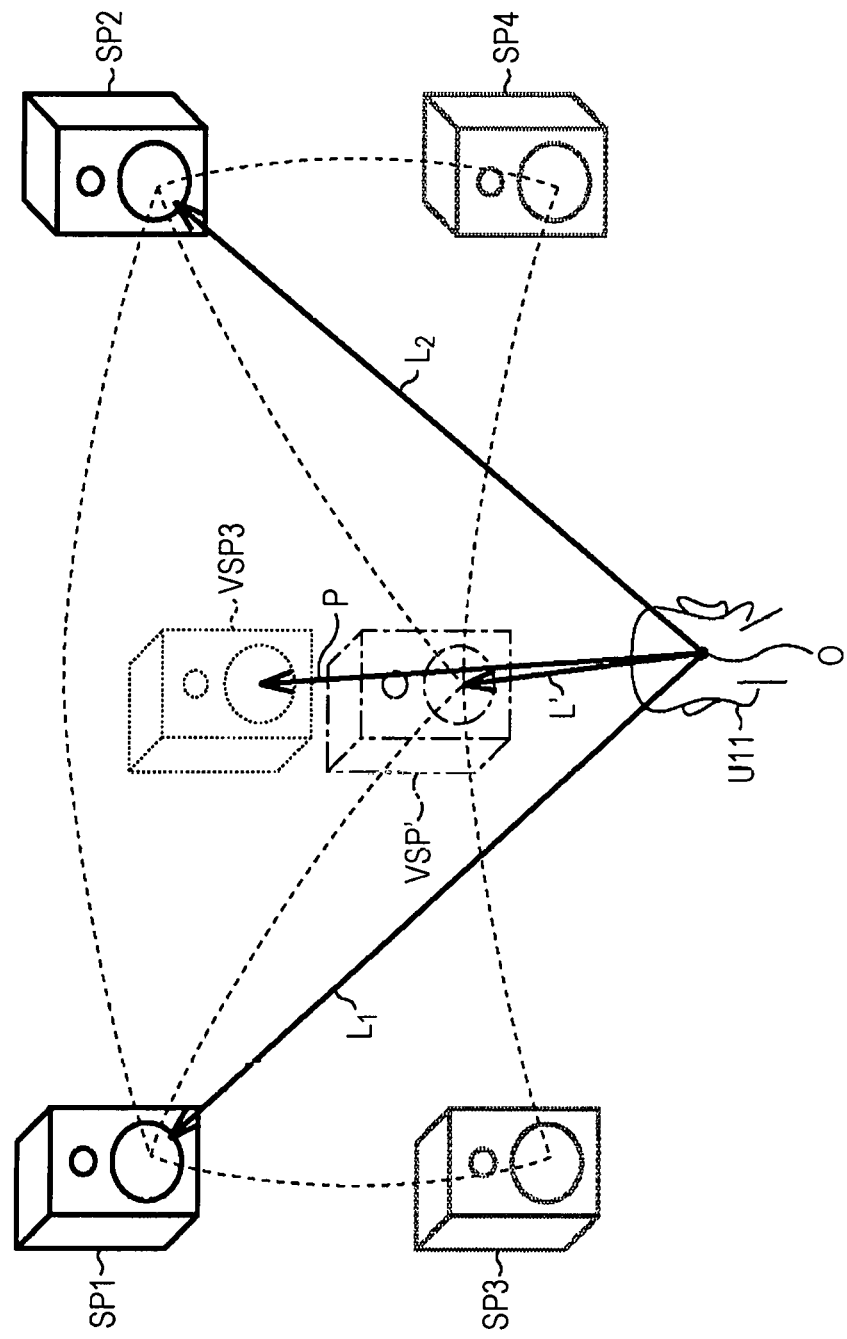
FIG. 7 is a diagram for explaining gain calculation according to the present technology.

As shown in FIG. 7, in the tetragon on the spherical plane having the speakers SP1 through SP4 at the corners, the side connecting the speakers SP3 and SP4 located at the lower left corner and the lower right corner in the drawing is selected, for example. The virtual speaker VSP' is assumed to exist at the position of the intersection point between the side connecting the speakers SP3 and SP4 and a perpendicular extending from the position of the virtual sound source VSP3, for example.

Three-dimensional VBAP is then performed with respect to the three speakers: the virtual speaker VSP', and the speakers SP1 and SP2 at the upper left corner and the upper right corner in the drawing. Specifically, a calculation is performed according to the same equation as the above described equation (2), to determine a coefficient $g_1$, a coefficient $g_2$, and a coefficient g', which are to be the gains of sounds to be output from the speaker SP1, the speaker SP2, and the virtual speaker VSP'.

In FIG. 7, a vector P is expressed as a linear sum of three vectors extending from the origin O, or of the vector $L_1$ extending toward the speaker SP1, the vector $L_2$ extending toward the speaker SP2, and the vector L' extending toward the virtual speaker VSP'. That is, the vector P is expressed as $P = g_1 L_1 + g_2 L_2 + g' L'$.

Figure 8:
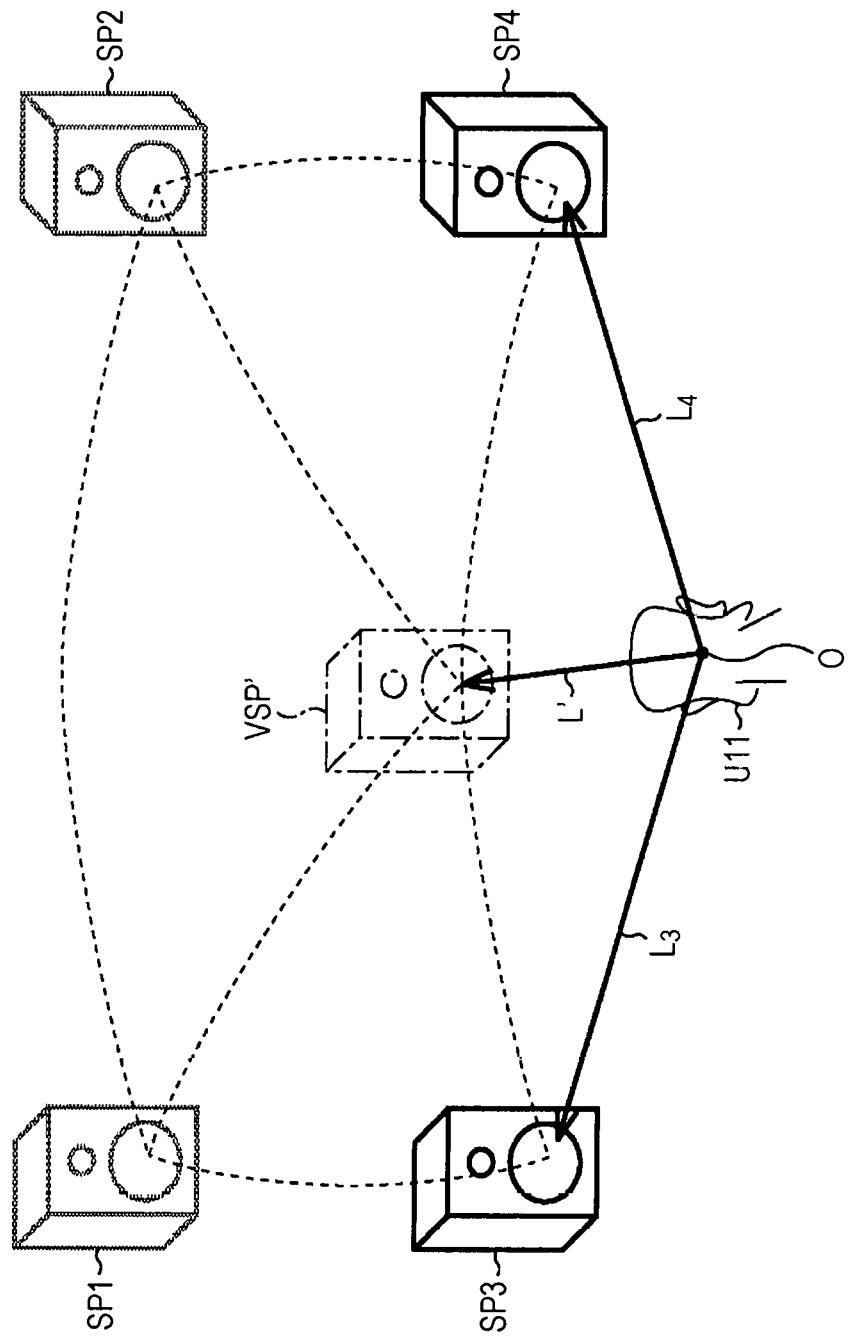
FIG. 8 is a diagram for explaining gain calculation according to the present technology.

Here, to fix a sound image at the position of the virtual sound source VSP3, the virtual speaker VSP' needs to output sound with the gain g', but the virtual speaker VSP' does not actually exist. Therefore, as shown in FIG. 8, the two speakers SP3 and SP4 at the two ends of the side on which the virtual speaker VSP' is located in the tetragon are used to fix the sound image at the position of the virtual speaker VSP' according to the present technology. In this manner, the virtual speaker VSP' is realized.

Specifically, two-dimensional VBAP is performed with respect to the two speakers SP3 and SP4, which are located at the two ends of the side on which the virtual speaker VSP' is located on the spherical plane. That is, a calculation is performed according to the same equation as the above described equation (1), to calculate a coefficient $g_3'$ and a coefficient $g_4'$, which are to be the gains of sounds to be output from the speaker SP3 and the speaker SP4, respectively.

In the example shown in FIG. 8, the vector L' extending toward the virtual speaker VSP' is expressed as a linear sum of the vector $L_3$ extending toward the speaker SP3 and the vector $L_4$ extending toward the speaker SP4. That is, the vector L' is expressed as $L' = g_3' L_3 + g_4' L_4$.

The value $g'g_3'$ obtained by multiplying the calculated coefficient $g_3'$ by the coefficient g' is set as the gain of the sound to be output from the speaker SP3, and the value $g'g_4'$ obtained by multiplying the calculated coefficient $g_4'$ by the coefficient g' is set as the gain of the sound to be output from the speaker SP4. In this manner, the virtual speaker VSP' that outputs sound with the gain g' is realized by the speakers SP3 and SP4.

Here, the value of $g'g_3'$ to be a gain value is the value of the coefficient $g_3$ in the above described equation (3), and the value of $g'g_4'$ to be a gain value is the value of the coefficient $g_4$ in the above described equation (3).

The values $g_1$, $g_2$, $g'g_3'$, and $g'g_4'$, which have been obtained as above and are not 0, are set as the gains of sounds of the respective channels to be output from the speakers SP1 through SP4. In this manner, the four speakers are made to output sound, and the sound image can be fixed at the target position.

As the sound image is fixed at a position by causing the four speakers to output sound as above, the localization position of the sound image can be made more stable than a sound image fixed at a position by a conventional VBAP technique. Accordingly, the sweet spot range can be widened.

<Example Structure of a Sound Processing Apparatus>

Figure 9:
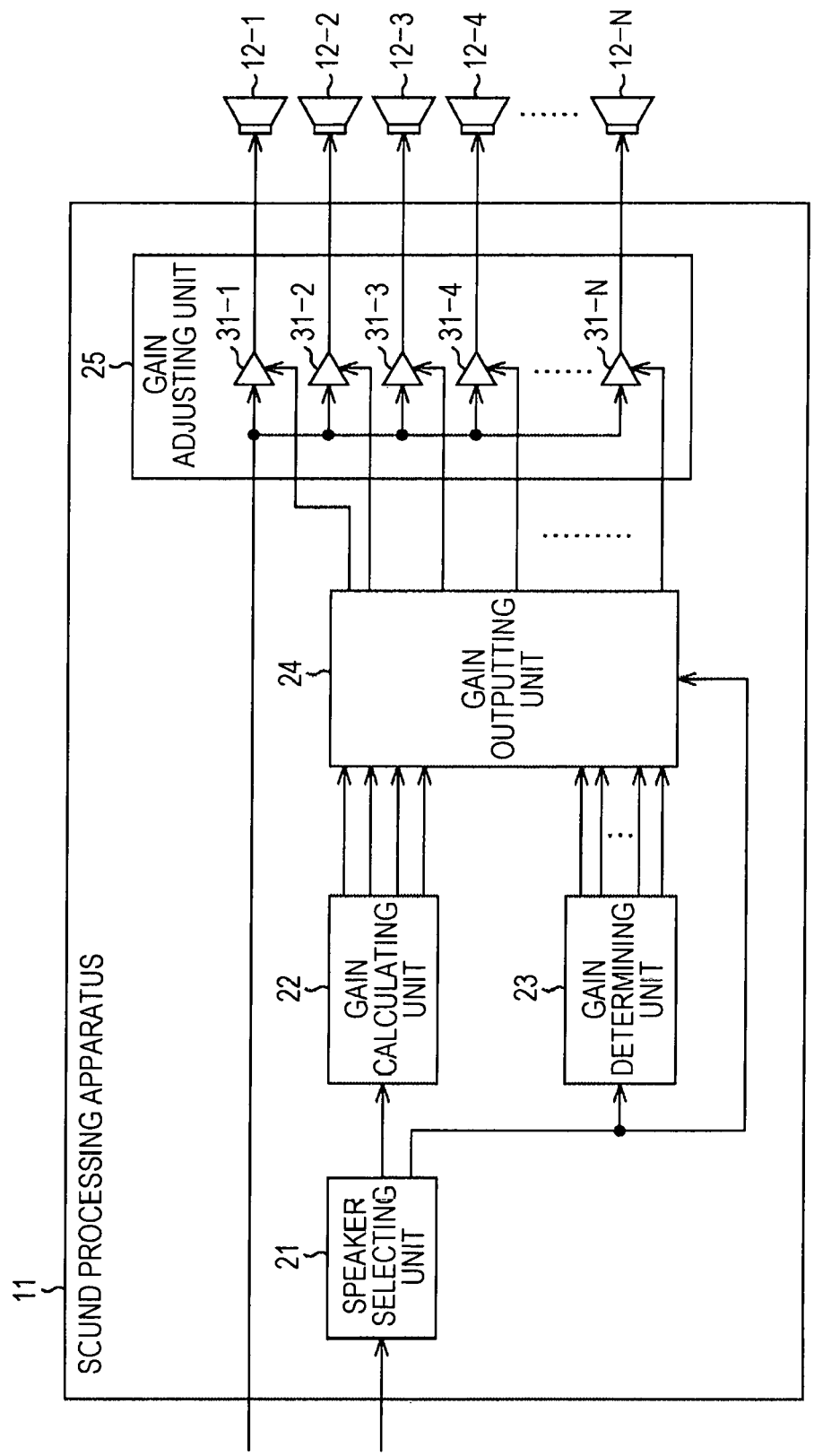
FIG. 9 is a diagram showing an example structure of a sound processing apparatus.

Next, a specific example to which the above described present technology is applied is described. FIG. 9 is a diagram showing an example structure of an embodiment of a sound processing apparatus to which the present technology is applied.

A sound processing apparatus 11 performs gain adjustment on a monaural sound signal supplied from outside for respective channels. By doing so, the sound processing apparatus 11 generates sound signals of N channels (N≥5), and supplies the sound signals to speakers 12-1 through 12-N corresponding to the N channels.

The speakers 12-1 through 12-N output sounds of the respective channels based on the sound signals supplied from the sound processing apparatus 11. That is, the speakers 12-1 through 12-N are sound outputting units serving as sound sources that output sounds of the respective channels. Hereinafter, when there is no particular need to distinguish the speakers 12-1 through 12-N from one another, the speakers 12-1 through 12-N will be also referred to simply as the speakers 12. Although the speakers 12 are not included in the sound processing apparatus 11 in FIG. 9, the speakers 12 may be included in the sound processing apparatus 11. Also, the respective components constituting the sound processing apparatus 11 and the speakers 12 may be provided in several apparatuses, to form a sound processing system including the respective components of the sound processing apparatus 11 and the speakers 12.

The speakers 12 are arranged to surround the position at which a user is assumed to exist when viewing and listening to content or the like (the position will be hereinafter also referred to simply as the user position). For example, the respective speakers 12 are arranged at positions on the plane of a sphere having its center at the user position. In other words, the respective speakers 12 are arranged at positions at the same distance from the user. Also, sound signals may be supplied from the sound processing apparatus 11 to the speakers 12 in a wired or wireless manner.

The sound processing apparatus 11 includes a speaker selecting unit 21, a gain calculating unit 22, a gain determining unit 23, a gain outputting unit 24, and a gain adjusting unit 25.

Sound signals of sound collected by a microphone attached to an object such as a mobile object, and position information about the object are supplied to the sound processing apparatus 11.

Based on the object's position information supplied from outside, the speaker selecting unit 21 identifies the position at which a sound image of sound to be emitted from the object in the space including the speakers 12 is to be fixed (the position to be identified will be hereinafter also referred to as the target sound image position), and supplies the result of the identification to the gain calculating unit 22.

Based on the target sound image position, the speaker selecting unit 21 selects four speakers 12 to output sound as processing-target speakers 12 from among the N speakers 12, and supplies select information indicating the result of the selection to the gain calculating unit 22, the gain determining unit 23, and the gain outputting unit 24.

The gain calculating unit 22 calculates gains of the processing-target speakers 12 based on the select information supplied from the speaker selecting unit 21 and the target sound image position, and supplies the gains to the gain outputting unit 24. The gain determining unit 23 determines gains of the speakers 12 other than the processing-target speakers based on the select information supplied from the speaker selecting unit 21, and supplies the gains to the gain outputting unit 24. For example, the gains of the speakers 12 that are not the processing targets are set at "0". That is, the speakers 12 that are not the processing targets are controlled not to output any sound of the object.

The gain outputting unit 24 supplies the N gains supplied from the gain calculating unit 22 and the gain determining unit 23, to the gain adjusting unit 25. At this point, the gain outputting unit 24 determines the supply destinations of the N gains supplied from the gain calculating unit 22 and the gain determining unit 23 in the gain adjusting unit 25 based on the select information supplied from the speaker selecting unit 21.

Based on the respective gains supplied from the gain outputting unit 24, the gain adjusting unit 25 performs gain adjustment on the object's sound signal supplied from outside, and supplies the resultant sound signals of the N channels to the speakers 12, so that the speakers 12 output sound.

The gain adjusting unit 25 includes amplifiers 31-1 through 31-N. Based on the gains supplied from the gain outputting unit 24, the amplifiers 31-1 through 31-N perform gain adjustment on the sound signal supplied from outside, and supply the resultant sound signals to the speakers 12-1 through 12-N.

Hereinafter, when there is no need to distinguish the amplifiers 31-1 through 31-N from one another, the amplifiers 31-1 through 31-N will be also referred to simply as the amplifiers 31.

<Example Structure of the Gain Calculating Unit>

Figure 10:
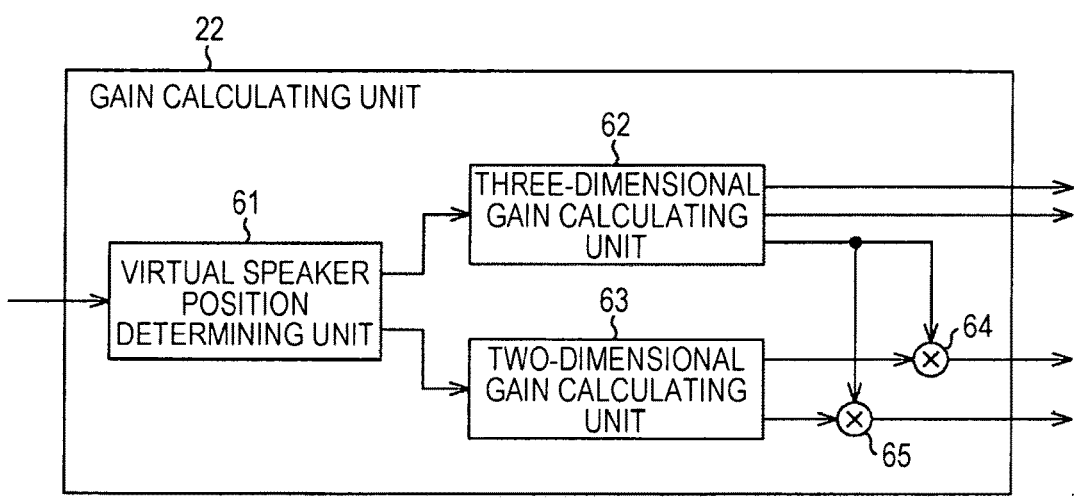
FIG. 10 is a diagram showing an example structure of a gain calculating unit.

The gain calculating unit 22 shown in FIG. 9 has the structure shown in FIG. 10, for example.

The gain calculating unit 22 shown in FIG. 10 includes a virtual speaker position determining unit 61, a three-dimensional gain calculating unit 62, a two-dimensional gain calculating unit 63, a multiplier 64, and a multiplier 65.

The virtual speaker position determining unit 61 determines the position of a virtual speaker based on information indicating the target sound image position and the select information supplied from the speaker selecting unit 21. The virtual speaker position determining unit 61 supplies the information indicating the target sound image position, the select information, and information indicating the position of the virtual speaker to the three-dimensional gain calculating unit 62, and supplies the select information and the information indicating the position of the virtual speaker to the two-dimensional gain calculating unit 63.

Based on the respective pieces of the information supplied from the virtual speaker position determining unit 61, the three-dimensional gain calculating unit 62 performs three-dimensional VBAP with respect to two speakers 12 of the processing-target speakers 12, and the virtual speaker. The three-dimensional gain calculating unit 62 then supplies the gains of the two speakers 12 obtained through the three-dimensional VBAP to the gain outputting unit 24, and supplies the gain of the virtual speaker to the multiplier 64 and the multiplier 65.

Based on the respective pieces of the information supplied from the virtual speaker position determining unit 61, the two-dimensional gain calculating unit 63 performs two-dimensional VBAP with respect to two speakers 12 of the processing-target speakers 12, and supplies the resultant gains of the speakers 12 to the multiplier 64 and the multiplier 65.

The multiplier 64 obtains ultimate gains of the speakers 12 by multiplying the gains supplied from the two-dimensional gain calculating unit 63 by the gains supplied from the three-dimensional gain calculating unit 62, and supplies the ultimate gains to the gain outputting unit 24. The multiplier 65 obtains ultimate gains of the speakers 12 by multiplying the gain supplied from the two-dimensional gain calculating unit 63 by the gains supplied from the three-dimensional gain calculating unit 62, and supplies the ultimate gains to the gain outputting unit 24.

<Description of a Sound Localization Control Process>

Meanwhile, when object's position information and an object's sound signal are supplied to the sound processing apparatus 11, and an instruction to output sound of the object is issued, the sound processing apparatus 11 starts a sound localization control process, to cause sound of the object to be output, and fix the sound image at an appropriate position.

Figure 11:
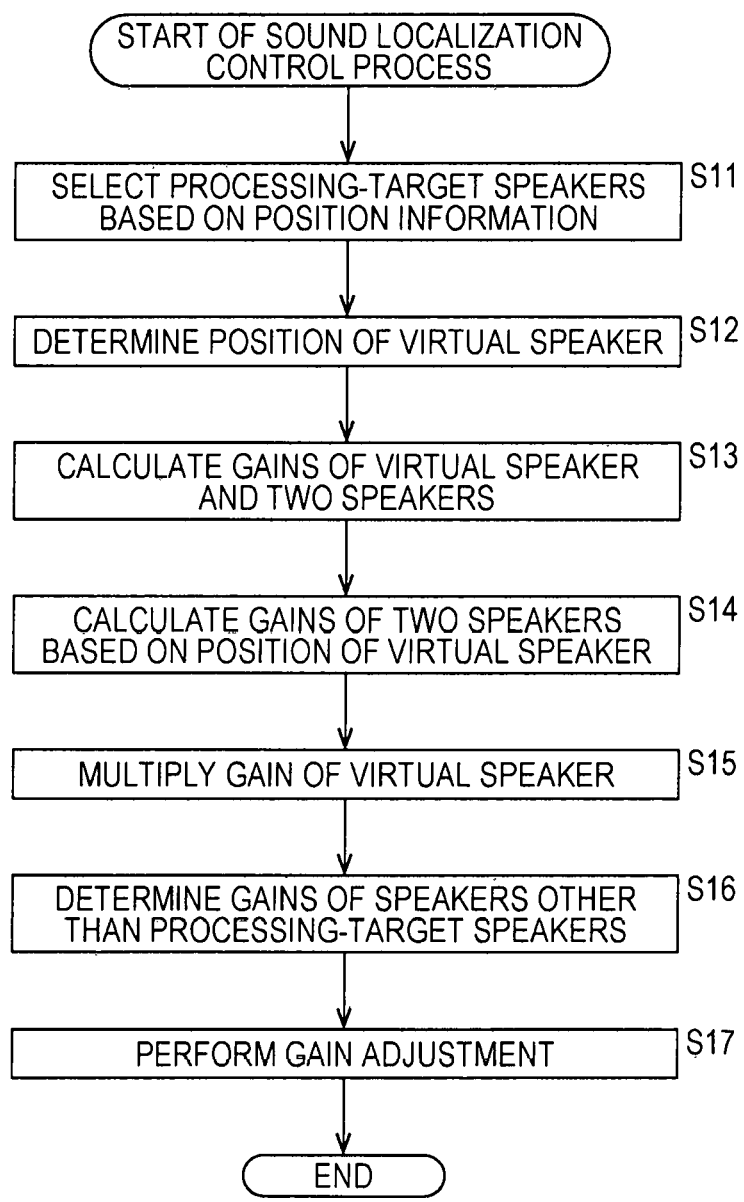
FIG. 11 is a flowchart for explaining a sound localization control process.

Referring now to the flowchart in FIG. 11, the sound localization control process to be performed by the sound processing apparatus 11 is described.

In step S11, the speaker selecting unit 21 selects processing-target speakers 12 based on the object's position information supplied from outside.

Specifically, the speaker selecting unit 21 identifies a target sound image position based on the object's position information, for example, and selects, from among the N speakers 12, the processing-target speakers 12 that are four speakers 12 that are located in the vicinity of the target sound image position and are arranged to surround the target sound image position.

In a case where the position of the virtual sound source VSP3 shown in FIG. 7 is set as the target sound image position, for example, the speakers 12 equivalent to the four speakers SP1 through SP4 surrounding the virtual sound source VSP3 are selected as the processing-target speakers 12.

The speaker selecting unit 21 supplies the information indicating the target sound image position to the virtual speaker position determining unit 61, and supplies the select information indicating the four processing-target speakers 12 to the virtual speaker position determining unit 61, the gain determining unit 23, and the gain outputting unit 24.

In step S12, the virtual speaker position determining unit 61 determines the position of the virtual speaker based on the information indicating the target sound image position and the select information supplied from the speaker selecting unit 21. As in the example shown in FIG. 7, for example, the position of the intersection point between the side connecting the speakers 12 located at the lower left corner and the lower right corner relative to the user among the processing-target speakers 12 on a spherical plane, and the perpendicular extending from the target sound image position toward the side is set as the position of the virtual speaker.

After the position of the virtual speaker is determined, the virtual speaker position determining unit 61 supplies the information indicating the target sound image position, the select information, and the information indicating the position of the virtual speaker to the three-dimensional gain calculating unit 62, and supplies the select information and the information indicating the position of the virtual speaker to the two-dimensional gain calculating unit 63.

The position of the virtual speaker may be any position, as long as it is located on a side of a tetragon on the spherical plane, the tetragon having the four processing-target speakers 12 at the respective corners. Even in a case where the number of processing-target speakers 12 is five or larger, the position of the virtual speaker may be any position on a side of a polygon on the spherical plane, the polygon having those processing-target speakers 12 at the corners.

In step S13, the three-dimensional gain calculating unit 62 calculates gains for the virtual speaker and two processing-target speakers 12 based on the information indicating the target sound image position, the select information, and the information about the position of the virtual speaker, the information having been supplied from the virtual speaker position determining unit 61.

Specifically, the three-dimensional gain calculating unit 62 determines the vector P to be the three-dimensional vector indicating the target sound image position, and determines the vector L' to be the three-dimensional vector extending toward the virtual speaker. The three-dimensional gain calculating unit 62 also determines the vector $L_1$ to be the vector extending toward the speaker 12 in the same positional relationship as the speaker SP1 shown in rig. 7 among the processing-target speakers 12, and the vector $L_2$ to be the vector extending toward the speaker 12 in the same positional relationship as the speaker SP2.

The three-dimensional gain calculating unit 62 then determines the equation expressing the vector P as the linear sum of the vector L', the vector $L_1$, and the vector $L_2$, and performs calculation according to the equation, to calculate gains that are the coefficient g', the coefficient $g_1$, and the coefficient $g_2$ of the vector L', the vector $L_1$, and the vector $L_2$, respectively. That is, the same calculation as the above described calculation according to the equation (2) is performed.

The three-dimensional gain calculating unit 62 supplies the calculated coefficients $g_1$ and $g_2$ of the speakers 12 in the same positional relationships as the speakers SP1 and SP2, as the gains of the sounds to be output from these speakers 12, to the gain outputting unit 24.

The three-dimensional gain calculating unit 62 also supplies the calculated coefficient g' of the virtual speaker, as the gain of the sound to be output from the virtual speaker, to the multiplier 64 and the multiplier 65.

In step S14, the two-dimensional gain calculating unit 63 calculates gains for two processing-target speakers 12 based on the select information and the information about the position of the virtual speaker, the information having been supplied from the virtual speaker position determining unit 61.

Specifically, the two-dimensional gain calculating unit 63 determines the vector L' to be the three-dimensional vector indicating the position of the virtual speaker. The two-dimensional gain calculating unit 63 also determines the vector $L_3$ to be the vector extending toward the speaker 12 in the same positional relationship as the speaker SP3 shown in FIG. 8 among the processing-target speakers 12, and the vector $L_4$ to be the vector extending toward the speaker 12 in the same positional relationship as the speaker SP4.

The two-dimensional gain calculating unit 63 then determines the equation expressing the vector L' as the linear sum of the vector $L_3$ and the vector $L_4$, and performs calculation according to the equation, to calculate gains that are the coefficient $g_3$' and the coefficient $g_4$' of the vector $L_3$ and the vector $L_4$, respectively. That is, the same calculation as the above described calculation according to the equation (1) is performed.

The two-dimensional gain calculating unit 63 supplies the calculated coefficients $g_3$' and $g_4$' of the speakers 12 in the same positional relationships as the speakers SP3 and SP4, as the gains of the sounds to be output from these speakers 12, to the multiplier 64 and the multiplier 65.

In step S15, the multiplier 64 and the multiplier 65 multiply the gains $g_3'$ and $g_4'$ supplied from the two-dimensional gain calculating unit 63 by the gain g' of the virtual speaker supplied from the three-dimensional gain calculating unit 62, and supplies the resultant gains to the gain outputting unit 24.

Accordingly, as the ultimate gain of the speaker 12 in the same positional relationship as the speaker SP3 shown in FIG. 8 among the four processing-target speakers 12, the gain $g_3 = g'g_3'$ is supplied to the gain outputting unit 24. Likewise, as the ultimate gain of the speaker 12 in the same positional relationship as the speaker SP4 shown in FIG. 8 among the four processing-target speakers 12, the gain $g_4 = g'g_4'$ is supplied to the gain outputting unit 24.

In step S16, the gain determining unit 23 determines gains of the speakers 12 other than the processing-target speakers based on the select information supplied from the speaker selecting unit 21, and supplies the gains to the gain outputting unit 24. For example, the gains of all the speakers 12 that are not the processing targets are set at "0".

After the gains $g_1$, $g_2$, $g'g_3'$, and $g'g_4'$ from the gain calculating unit 22, and the gain "0" from the gain determining unit 23 are supplied to the gain outputting unit 24, the gain outputting unit 24 supplies these gains to the amplifiers 31 of the gain adjusting unit 25 based on the select information supplied from the speaker selecting unit 21.

Specifically, the gain outputting unit 24 supplies the gains $g_1$, $g_2$, $g'g_3'$, and $g'g_4'$ to the amplifiers 31 that supply sound signals to the respective processing-target speakers 12, or the respective speakers 12 equivalent to the speakers SP1 through SP4 shown in FIG. 7. For example, in a case where the speaker 12 equivalent to the speaker SP1 is the speaker 12-1, the gain outputting unit 24 supplies the gain $g_1$ to the amplifier 31-1.

The gain outputting unit 24 also supplies the gain "0" supplied from the gain determining unit 23, to the amplifiers 31 that supply sound signals to the speakers 12 that are not processing targets.

In step S17, the amplifiers 31 of the gain adjusting unit 25 perform gain adjustment on an object's sound signal supplied from outside based on the gains supplied from the gain outputting unit 24, and supply the resultant sound signals to the speakers 12, so that the speakers 12 output sound.

The respective speakers 12 output sound based on the sound signals supplied from the amplifiers 31. More specifically, only the four processing-target speakers 12 output sound. Accordingly, a sound image can be fixed at a target position. As sound is output from the speakers 12, the sound localization control process comes to an end.

As described above, the sound processing apparatus 11 selects four speakers 12 as processing targets based on position information about an object, and performs VBAP with respect to a combination of two or three speakers among those speakers 12 and a virtual speaker. The sound processing apparatus 11 then performs gain adjustment on a sound signal based on the gains of the respective processing-target speakers 12, the gains having been obtained through VBAP performed on different combinations.

Accordingly, sound can be output from the four speakers 12 surrounding the target sound image position, and localization of sound can be made more stable. As a result, the sweet spot range can be made wider.

<Second Embodiment>
<Gain Calculation>

In the above described example, two or three speakers to form one combination of speakers are selected from among five speakers including a virtual speaker, and VBAP is performed on more than one combination, to calculate gains of the processing-target speakers 12. According to the present technology, however, it is also possible to calculate gains by selecting combinations from among four processing-target speakers 12, and performing VBAP on each of the combinations, without any virtual speaker determined.

Figure 12:
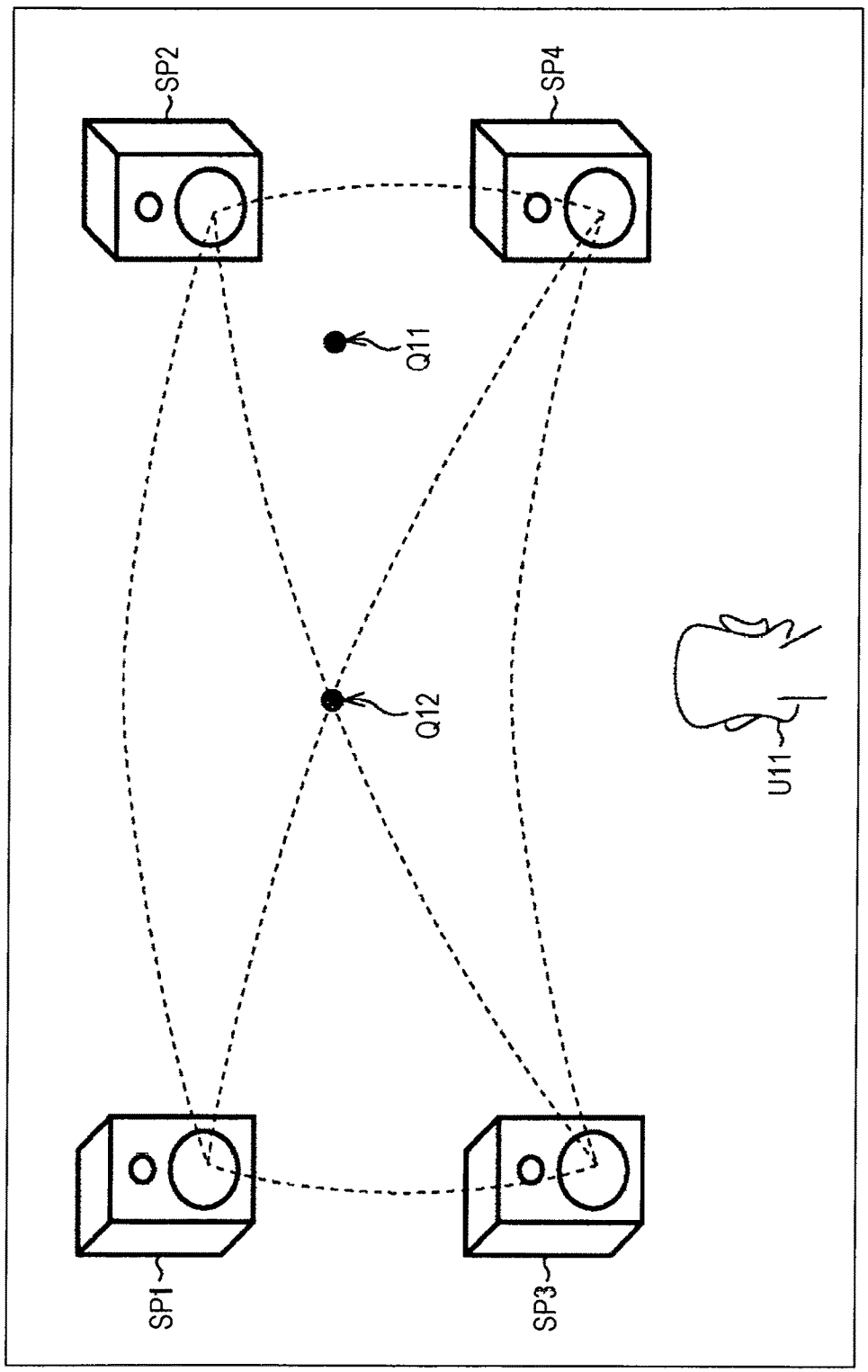
FIG. 12 is a diagram for explaining another method of calculating gains of speakers.

In such a case, the number of times VBAP should be performed varies depending on the target sound image position, as shown in FIG. 12, for example. In FIG. 12, the components equivalent to those shown in FIG. 7 are denoted by the same reference numerals as those used in FIG. 7, and explanation of them will not be unnecessarily repeated.

In a case where the position of a virtual sound source, or a target sound image position, is the position indicated by an arrow Q11, for example, the position indicated by the arrow Q11 is in a triangular area surrounded by a speaker SP1, a speaker SP2, and a speaker SP4 on a spherical plane. Accordingly, if three-dimensional VBAP is performed with respect to the combination of speakers consisting of the speakers SP1, SP2, and SP4 (this combination will be hereinafter also referred to as the first combination), the gains of sounds to be output from the three speakers SP1, SP2, and SP4 are determined.

Meanwhile, the position indicated by the arrow Q11 is also a position in a triangular area surrounded by the speaker SP2, a speaker SP3, and the speaker SP4 on the spherical plane. Accordingly, if three-dimensional VBAP is performed with respect to the combination of speakers consisting of the speakers SP2, SP3, and SP4 (this combination will be hereinafter also referred to as the second combination), the gains of sounds to be output from the three speakers SP2, SP3, and SP4 are determined.

Here, each of the gains of the speakers not used in the first combinations and the second combinations is set at "0", so that two sets of gains can be obtained as the respective gains of the four speakers SP1 through SP4 in the first and second combinations.

For each of the speakers, the sum of the gains of the speaker obtained in the first and the second combinations is obtained as a gain sum. For example, where the gain of the speaker SP1 in the first combination is $g_1(1)$, and the gain of the speaker SP1 in the second combination is $g_1(2)$, the gain sum $g_{s1}$ of the speaker SP1 is expressed as the gain sum $g_{s1} = g_1(1) | g_1(2)$.

Since the speaker SP1 is not included in the second combination, $g_1(2)$ is 0. Since the speaker SP1 is included in the first combination of speakers, $g_1(1)$ is not 0. as a result, the gain sum $g_{s1}$ of the speaker SP1 is not 0. The same applies to the gain sums of the other speakers SP2 through SP4.

As the gain sums of the respective speakers are determined in the above manner, the values obtained by normalizing the gain sums of the respective speakers with the sum of squares of these gain sums are set as the ultimate gains of these speakers, or more specifically, as the gains of the sounds to be output form the speakers.

As the gains of the respective speakers SP1 through SP4 are determined in the above manner, gains that are not 0 are invariably obtained. Accordingly, each of the four speakers SP1 through SP4 can be made to output sound, and a sound image can be fixed at a desired position.

In the description below, the gain of a speaker SPk ($1 \leq k \leq 4$) in a mth combination ($1 \leq m \leq 4$) is represented by $g_k(m)$. The gain sum of a speaker SPk ($1 \leq k \leq 4$) is represented by $g_{sk}$.

Further, in a case where the target sound image position is the position indicated by an arrow Q12, or the position of the intersection point between the line connecting the speaker SP2 and the speaker SP3 and the line connecting the speaker SP1 and the speaker SP4 on the spherical plane, there are four combinations of three speakers.

Specifically, where there is the combination of the speaker SP1, the speaker SP2, and the speaker SP3 (this combination will be hereinafter referred to as the first combination), the combination of the speaker SP1, the speaker SP2, and the speaker SP4 (this combination will be hereinafter referred to as the second combination) is possible. Also, where there is the combination of the speaker SP1, the speaker SP3, and the speaker SP4 (this combination will be hereinafter referred to as the third combination), the combination of the speaker SP2, the speaker SP3, and the speaker SP4 (this combination will be hereinafter referred to as the fourth combination) is possible.

In this case, three-dimensional VBAP is performed on each of the first through fourth combinations, to determine the gains of the respective speakers. The sum of the four gains obtained with respect to the same speaker is set as a gain sum, and the values obtained by normalizing the gain sums of the respective speakers with the sum of squares of the four gain sums determined with respect to the respective speakers are set as the ultimate gains of these speakers.

In a case where the target sound image position is the position indicated by the arrow Q12, if the tetragon formed with the speakers SP1 through SP4 on the spherical plane is a rectangle or the like, the same result of calculation as three-dimensional VBAP is obtained from the first combination and the fourth combination, for example. Accordingly, if three-dimensional VBAP is performed with respect to appropriate two combinations such as the first and second combinations in this case, the gains of the respective speakers can be obtained. However, in a case where the tetragon formed with the speakers SP1 through SP4 on the spherical plane is not a rectangle or the like but an asymmetric tetragon, it is necessary to perform three-dimensional VBAP with respect to each of the four combinations.

<Example Structure of the Gain Calculating Unit>

Figure 13:
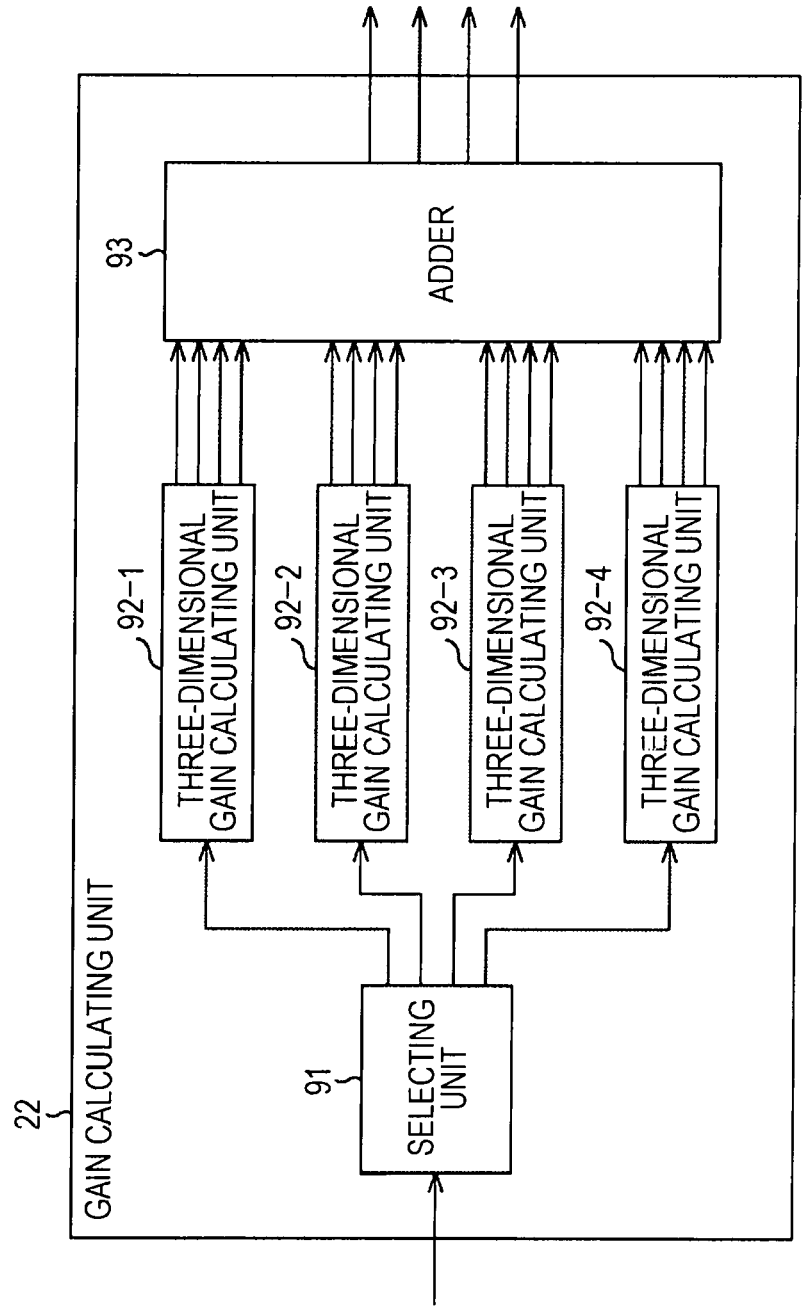
FIG. 13 is a diagram showing another example structure of a gain calculating unit.

In a case where gains are calculated by selecting combinations of speakers from among four processing-target speakers 12 and performing VBAP with respect to each of those combinations, without any virtual speaker determined, the gain calculating unit 22 shown in FIG. 9 has the structure shown in FIG. 13, for example.

The gain calculating unit 22 shown in FIG. 13 includes a selecting unit 91, a three-dimensional gain calculating unit 92-1, a three-dimensional gain calculating unit 92-2, a three-dimensional gain calculating unit 92-3, a three-dimensional gain calculating unit 92-4, and an adder 93.

Based on information indicating the target sound image position and select information supplied from a speaker selecting unit 21, the selecting unit 91 determines combinations of three speakers 12 surrounding the target sound image position from among four speakers 12 selected as the processing targets. The selecting unit 91 supplies information indicating the combinations of speakers 12 and the information indicating the target sound image position to the three-dimensional gain calculating units 92-1 through 92-4.

The three-dimensional gain calculating units 92-1 through 92-4 perform three-dimensional VBAP based on the information indicating the combinations of speakers 12 and the information indicating the target sound image position supplied from the selecting unit 91, and supply the resultant gains of the respective speakers 12 to the adder 93. In the description below, where there is no particular need to distinguish the three-dimensional gain calculating units 92-1 through 92-4 from one another, the three-dimensional gain calculating units 92-1 through 92-4 will be also referred to simply as the three-dimensional gain calculating units 92.

The adder 93 determines gain sums based on the gains of the respective processing-target speakers 12 supplied from the three-dimensional gain calculating units 92-1 through 92-4, and calculates the ultimate gains of the respective processing-target speakers 12 by normalizing these gain sums. The adder 93 then supplies the ultimate gains to the gain outputting unit 24.

<Description of a Sound Localization Control Process>

Figure 14:
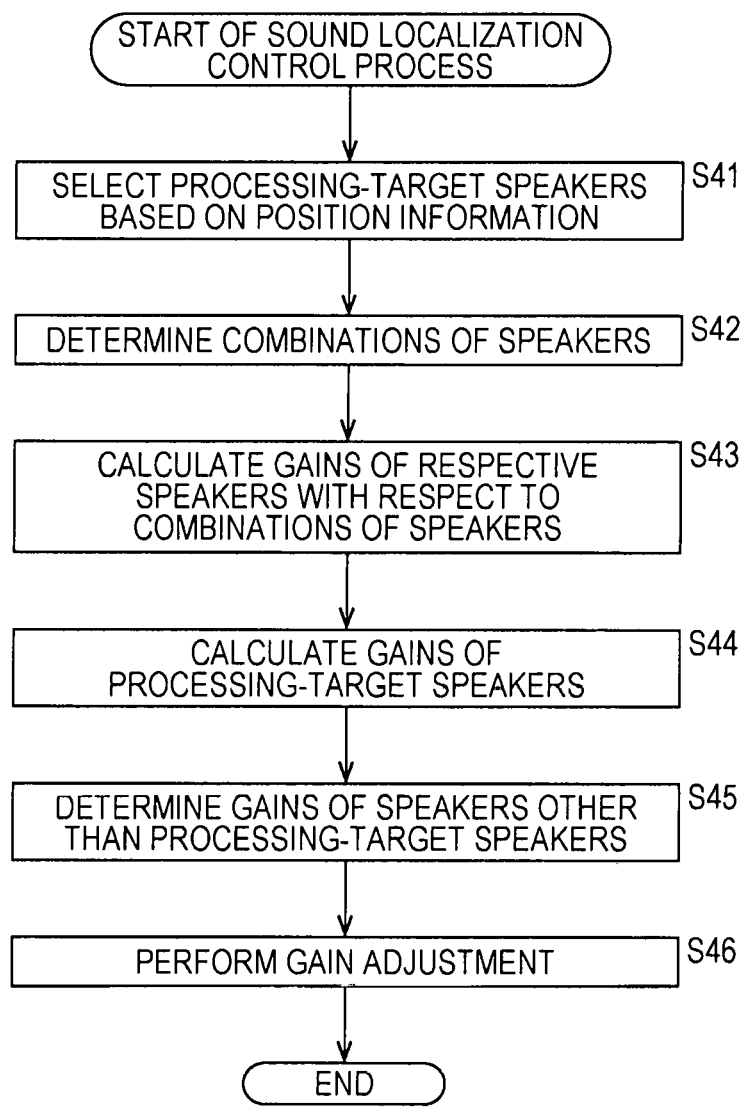
FIG. 14 is a flowchart for explaining a sound localization control process.

Referring now to the flowchart in FIG. 14, a sound localization control process to be performed in a case where the gain calculating unit 22 has the structure shown in FIG. 13 is described.

The procedure in step S41 is the same as the procedure in step S11 in FIG. 11, and therefore, explanation thereof is not repeated herein.

In step S42, the selecting unit 91 determines combinations of speakers 12 based on the information indicating the target sound image position and the select information supplied from the speaker selecting unit 21, and supplies information indicating the combinations of speakers 12 and the information indicating the target sound image position to the three-dimensional gain calculating units 92.

In a case where the target sound image position is the position indicated by the arrow Q11 in FIG. 12, for example, the combination (the first combination) of the speakers 12 including the three speakers 12 equivalent to the speakers SP1, SP2, and SP4 is determined. Also, the combination (the second combination) of the speakers 12 including the three speakers 12 equivalent to the speakers SP2, SP3, and SP4 is determined.

In this case, the selecting unit 91 supplies information indicating the first combination of speakers 12 and the information indicating the target sound image position to the three-dimensional gain calculating unit 92-1, and supplies information indicating the second combination of speakers 12 and the information indicating the target sound image position to the three-dimensional gain calculating unit 92-2. In this case, the information indicating the combinations of speakers 12 and the like are not supplied to the three-dimensional gain calculating units 92-3 and 92-4, and the three-dimensional gain calculating units 92-3 and 92-4 do not perform any calculation of three-dimensional VBAP, either.

In step S43, based on the information indicating the combinations of speakers 12 and the information indicating the target sound image position supplied from the selecting unit 91, the three-dimensional gain calculating units 92 calculate gains of the respective speakers 12 in the combinations of speakers 12, and supply the gains to the adder 93.

Specifically, the three-dimensional gain calculating units 92 determine gains of the respective speakers 12 by carrying out the same procedure as that in step S13 in FIG. 11 with respect to the three speakers 12 indicated by the information indicating the combination of speakers 12. That is, the same calculation as the above described calculation according to the equation (2) is performed. The gain of the remaining one speaker 12 other than the three speakers 12 indicated by the information indicating the combination of speakers 12 among the four processing-target speakers 12 is set at "0".

In a case where the two combinations, the first and second combinations, are determined in step S42, for example, the three-dimensional gain calculating unit 92-1 calculates gains of the respective speakers 12 through three-dimensional VBAP with respect to the first combination. The three-dimensional gain calculating unit 92-2 calculates gains of the respective speakers 12 through three-dimensional VBAP with respect to the second combination.

Specifically, the combination of the speakers including the three speakers 12 equivalent to the speakers SP1, SP2, and SP4 shown in FIG. 12 is determined as the first combination. In this case, the three-dimensional gain calculating unit 92-1 calculates the gain $g_1(1)$ of the speaker 12 equivalent to the speaker SP1, the gain $g_2(1)$ of the speaker 12 equivalent to the speaker SP2, and the gain $g_4(1)$ of the speaker 12 equivalent to the speaker SP4. Meanwhile, the gain $g_3(1)$ of the speaker 12 equivalent to the speaker SP3 is set at "0".

In step S44, the adder 93 calculates ultimate gains of the processing-target speakers 12 based on the gains of the respective speakers 12 supplied from the three-dimensional gain calculating units 92, and supplies the ultimate gains to the gain outputting unit 24.

For example, the adder 93 calculates the gain sum $g_{s1}$ of the speaker 12 equivalent to the speaker SP1 by determining the sum of the gains $g_1(1)$, $g_1(2)$, $g_1(3)$, and $g_1(4)$ of the speaker 12, the gains having been supplied from the three-dimensional gain calculating units 92. Likewise, the adder 93 also calculates the gain sum $g_{s2}$ of the speaker 12 equivalent to the speaker SP2, the gain sum $g_{s3}$ of the speaker 12 equivalent to the speaker SP3, and the gain sum $g_{s4}$ of the speaker 12 equivalent to the speaker SP4.

The adder 93 then determines the ultimate gain $g_1$ (coefficient $g_1$) of the speaker 12 equivalent to the speaker SP1 by normalizing the gain sum $g_{s1}$ of the speaker 12 equivalent to the speaker SP1 with the sum of squares of the gain sums $g_{s1}$ through $g_{s4}$. The adder 93 also determines the ultimate gains $g_2$ through $g_4$ of the speakers 12 equivalent to the speakers SP2 through SP4 through the same calculation as above.

After the gains of the processing-target speakers 12 are determined in the above manner, the procedures in steps S45 and S46 are carried out, and the sound localization control process then comes to an end. However, these procedures are the same as the procedures in steps S16 and S17 in FIG. 11, and therefore, explanation of them is not repeated herein.

As described above, the sound processing apparatus 11 selects four speakers 12 as processing targets based on position information about an object, and performs VBAP with respect to combinations of speakers 12 that are three speakers 12 among the four processing-target speakers 12. The sound processing apparatus 11 then determines the ultimate gains of the respective processing-target speakers 12 by determining the sum of gains of each speaker 12 obtained through VBAP performed with respect to different combinations, and performs gain adjustment on sound signals.

Accordingly, sound can be output from the four speakers 12 surrounding the target sound image position, and localization of sound can be made more stable. As a result, the sweet spot range can be made wider.

Although an example case where four speakers 12 surrounding the target sound image position are the processing-target speakers 12 has been described in this embodiment, the number of speakers 12 to be selected as the processing targets may be four or larger.

For example, in a case where five speakers 12 are selected as the processing-target speakers 12, the combination of speakers 12 consisting of three speakers 12 surrounding the target sound image position is selected as one combination among the five speakers 12.

Figure 15:
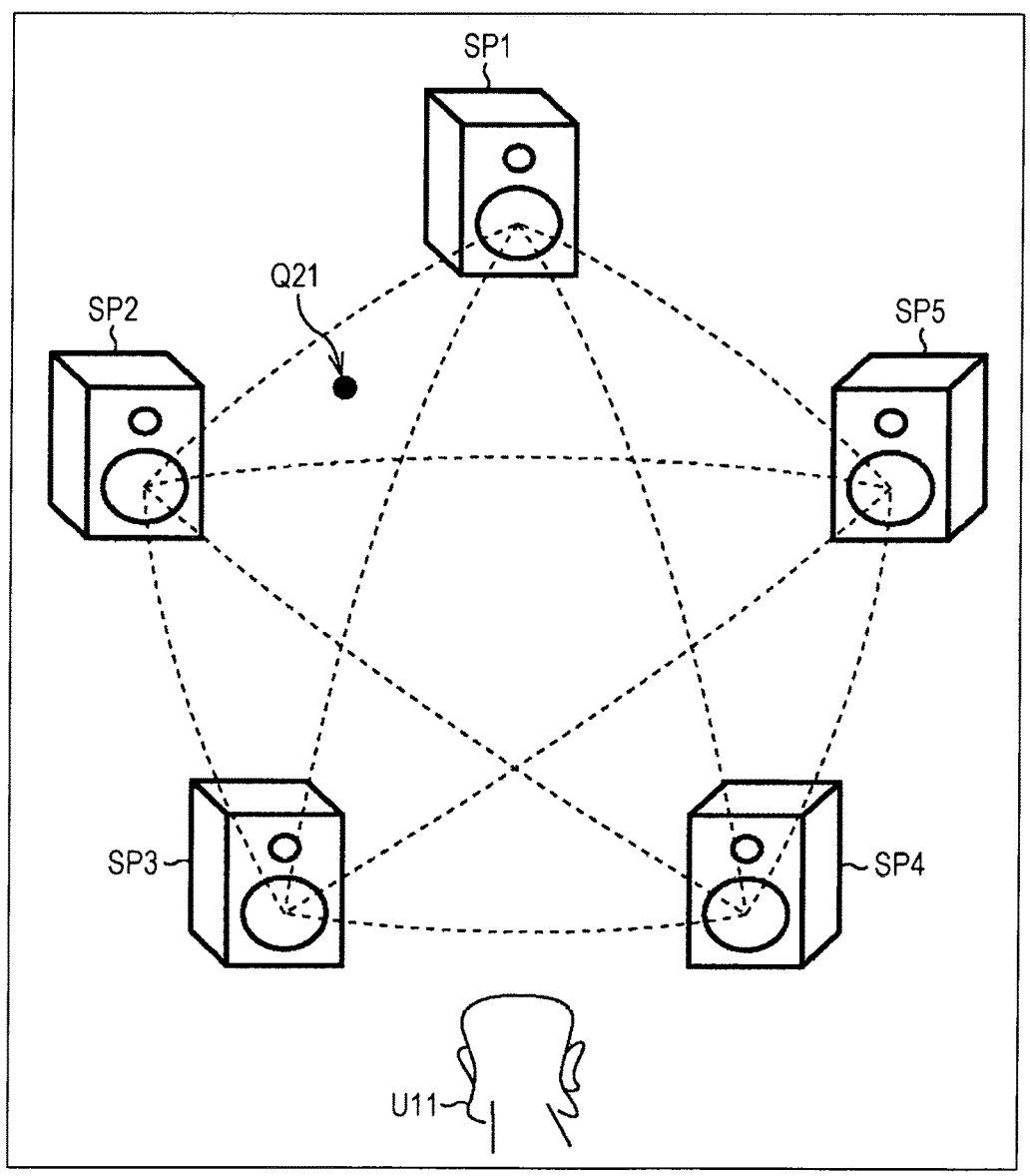
FIG. 15 is a diagram for explaining a method of calculating gains of speakers.

Specifically, as shown in FIG. 15, speakers 12 equivalent to five speakers SP1 through SP5 are selected as processing-target speakers 12, and the target sound image position is the position indicated by an arrow Q21.

In this case, the combination of the speakers SP1, SP2, and SP3 is selected as a first combination, and the combination of the speakers SP1, SP2, and SP4 is selected as a second combination. Also, the combination of the speakers SP1, SP2, and SP5 is selected as a third combination.

Gains of the respective speakers are determined with respect to the first through third combinations, and ultimate gains are calculated from the gain sums of the respective speakers. That is, with respect to the first through third combinations, the procedure in step S43 in FIG. 14 is carried out, and the procedures in steps S44 through S46 are then carried out.

As described above, in a case where five or more speakers 12 are selected as the processing-target speakers 12, sound is also output from all the processing-target speakers 12, so that a sound image can be fixed.

The above described series of processes may be performed by hardware or may be performed by software. Where the series of processes are to be performed by software, the program that forms the software is installed into a computer. Here, the computer may be a computer incorporated into special-purpose hardware, or may be a general-purpose computer that can execute various kinds of functions as various kinds of programs are installed thereinto.

Figure 16:
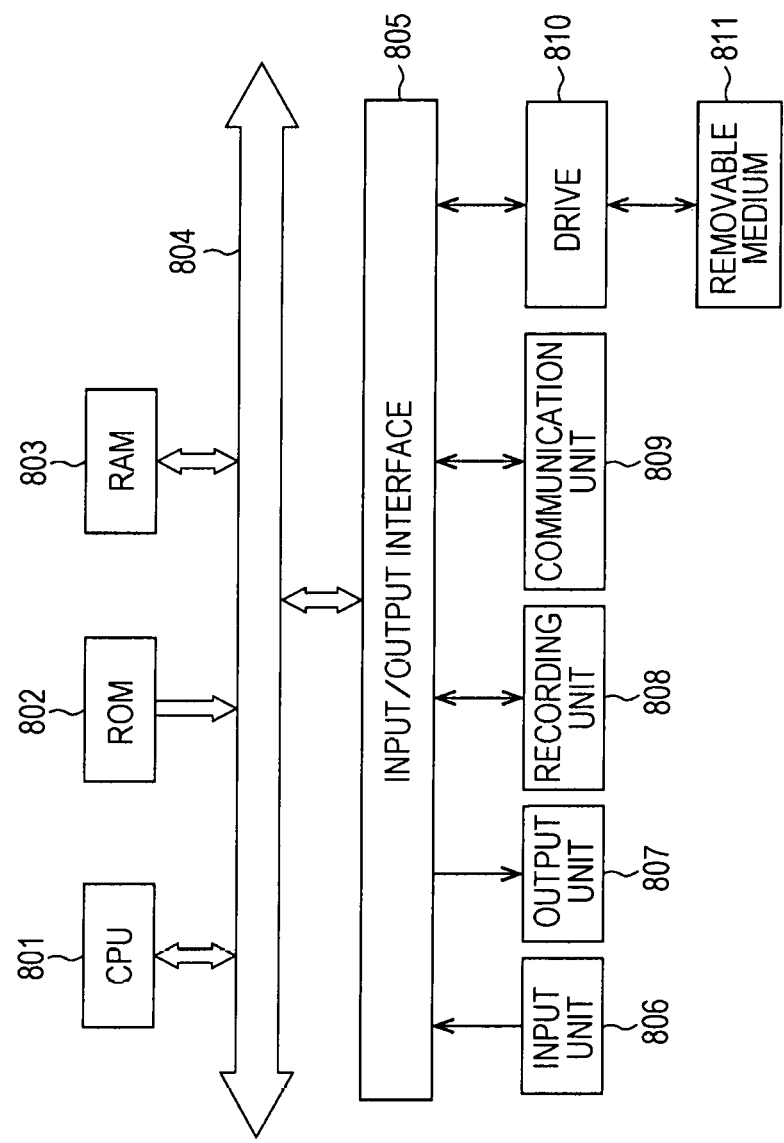
FIG. 16 is a diagram showing an example configuration of a computer.

FIG. 16 is a block diagram showing an example structure of the hardware of a computer that performs the above described series of processes in accordance with programs.

In the computer, a CPU 801, a ROM 802, and a RAM 803 are connected to one another by a bus 804.

An input/output interface 805 is further connected to the bus 804. An input unit 806, an output unit 807, a recording unit 808, a communication unit 809, and a drive 810 are connected to the input/output interface 805.

The input unit 806 is formed with a keyboard, a mouse, a microphone, an imaging device, and the like. The output unit 807 is formed with a display, a speaker, and the like. The recording unit 808 is formed with a hard disk, a nonvolatile memory, or the like. The communication unit 809 is formed with a network interface or the like. The drive 810 drives a removable medium 811 such as a magnetic disk, an optical disk, a magnetooptical disk, or a semiconductor memory.

In the computer having the above described structure, the CPU 801 loads a program recorded in the recording unit 808 into the RAM 803 via the input/output interface 805 and the bus 804, for example, and executes the program, so that the above described series of processes are performed.

The program to be executed by the computer (the CPU 801) may be recorded on the removable medium 811 as a package medium to be provided, for example. Alternatively, the program can be provided via a wired or wireless transmission medium such as a local area network, the Internet, or digital satellite broadcasting.

In the computer, the program can be installed into the recording unit 808 via the input/output interface 805 when the removable medium 811 is mounted on the drive 810. The program can also be received by the communication unit 809 via a wired or wireless transmission medium, and be installed into the recording unit 808. Alternatively, the program may be installed beforehand into the ROM 802 or the recording unit 808.

The program to be executed by the computer may be a program for performing processes in chronological order in accordance with the sequence described in this specification, or may be a program for performing processes in parallel or performing a process when necessary, such as when there is a call.

It should be noted that embodiments of the present technology are not limited to the above described embodiments, and various modifications may be made to them without departing from the scope of the present technology.

For example, the present technology can be embodied in a cloud computing structure in which one function is shared among apparatuses via a network, and processing is performed by the apparatuses cooperating with one another.

The respective steps described with reference to the above described flowcharts can be carried out by one device or can be shared among devices.

In a case where more than one process is included in one step, the processes included in the step can be performed by one device or can be shared among devices.

Further, the present technology may take the following forms.

[1]

A sound processing apparatus including:

four or more sound outputting units;

a gain calculating unit that determines output gains of sounds to be output from the four or more sound outputting units located close to a sound image localization position as a target position by calculating gains of sounds to be output from the sound outputting units based on a positional relationship between the sound outputting units with respect to each of different combinations among combinations of two or three of the four or more sound outputting units, the output gains being to be used for fixing a sound image at the sound image localization position; and a gain adjusting unit that performs gain adjustment on sounds to be output from the sound outputting units based on the output gains.

[2]

The sound processing apparatus of [1], wherein at least four of the output gains each have a value other than 0.

[3]

The sound processing apparatus of [1] or [2], wherein the gain calculating unit includes:

a first gain calculating unit that calculates output gains of a virtual sound outputting unit and two of the sound outputting units based on a positional relationship among the virtual sound outputting unit, the two of the sound outputting units, and the sound image localization position;

a second gain calculating unit that calculates gains of other two of the sound outputting units than the two of the sound outputting units based on a positional relationship among the other two of the sound outputting units and the virtual sound outputting unit, the gains of the other two of the sound outputting units being to be used for fixing a sound image at a position of the virtual sound outputting unit; and a calculating unit that calculates output gains of the other two of the sound outputting units based on the gains of the other two of the sound outputting units and the output gain of the virtual sound outputting unit.

[4]

The sound processing apparatus of [3], wherein the calculating unit calculates the output gains of the other two of the sound outputting units by multiplying the gains of the other two of the sound outputting units by the output gain of the virtual sound outputting unit.

[5]

The sound processing apparatus of [3] or [4], wherein the position of the virtual sound outputting unit is on a side of a polygon having the four or more sound outputting units at the corners thereof.

[6]

The sound processing apparatus of [1] or [2], wherein the gain calculating unit includes:

a virtual gain calculating unit that calculates output gains of three of the sound outputting units based on a positional relationship among the three of the sound outputting units and the sound image localization position; and a calculating unit that calculates ultimate output gains of the sound outputting units based on the output gains calculated by the virtual gain calculating unit calculating the output gains with respect to different combinations among the combinations.

[7]

The sound processing apparatus of [6], wherein the calculating unit calculates an ultimate output gain of the same one of the sound outputting units by determining a sum of the output gains determined with respect to the same one of the sound outputting units.

REFERENCE SIGNS LIST

11 Sound processing apparatus
12-1 through 12-N, and 12 Speaker
21 Speaker selecting unit
22 Gain calculating unit
25 Gain adjusting unit
61 Virtual speaker position determining unit
62 Three-dimensional gain calculating unit
63 Two-dimensional gain calculating unit
64 Multiplier
65 Multiplier
91 Selecting unit
92-1 through 92-4, and 92 Three-dimensional gain calculating unit
93 Adder

The invention claimed is:

1. A sound processing apparatus comprising:

at least four speakers;

virtual speaker position determining circuitry configured to determine a position of a virtual speaker based on positions of the at least four speakers;

virtual speaker gain calculating circuitry configured to calculate a gain of the virtual speaker at least by performing three-dimensional Vector Base Amplitude Panning (VBAP) based on a positional relationship among the virtual speaker, two speakers of the at least four speakers, and a sound image localization position; and gain adjusting circuitry configured to perform gain adjustment on sounds to be output from at least the two speakers based on the gain of the virtual speaker, wherein the at least four speakers are configured to output sounds to a listener according to output of the gain adjusting circuitry.

2. The sound processing apparatus according to claim 1, wherein gains of the at least four speakers each have a value other than 0.

3. The sound processing apparatus according to claim 2, wherein the virtual speaker gain calculating circuitry is further configured to calculate gains of the two speakers of the at least four speakers based on the positional relationship among the virtual speaker, the two speakers of the at least two speakers, and the sound image localization position, and wherein the sound process apparatus further comprises:

other gain calculating circuitry configured to calculate gains of other two speakers of the at least four speakers than the two speakers of the at least four speakers based on a positional relationship among the other two speakers and the virtual speaker, the gains of the other two speakers to be used for fixing a sound image at the position of the virtual speaker; and calculating circuitry configured to calculate output gains of the other two speakers based on the gains of the other two speakers and an output gain of the virtual sound outputting unit.

4. The sound processing apparatus according to claim 3, wherein the calculating circuitry is configured to calculate the output gains of the other two of the sound outputting units by multiplying the gains of the other two of the sound outputting units by the output gain of the virtual sound outputting unit.

5. The sound processing apparatus according to claim 3, wherein the position of the virtual speaker is on a side of a polygon having the at least four speakers at corners thereof.

6. A sound processing apparatus comprising:

virtual speaker position determining circuitry configured to determine a position of a virtual speaker based on positions of four speakers located near the virtual speaker;

virtual speaker gain calculating circuitry configured to calculate a gain of the virtual speaker by performing three-dimensional Vector Base Amplitude Panning (VBAP) with respect to the virtual speaker and two speakers among the four speakers, based on a positional relationship among the virtual speaker, the two speakers, and a sound image localization position; and gain adjusting circuitry configured to perform gain adjustment on sounds to be output from at least the two speakers based on the gain of the virtual speaker, and to output a result of the gain adjustment to cause the four speakers to output sounds to a listener according to the result of the gain adjustment.

7. A sound processing method comprising acts of:

determining a position of a virtual speaker based on positions of four speakers located near the virtual speaker;

calculating a gain of the virtual speaker by performing three-dimensional Vector Base Amplitude Panning (VBAP) with respect to the virtual speaker and two speakers among the four speakers, based on a positional relationship among the virtual speaker, the two speakers, and a sound image localization position;

performing gain adjustment on sounds to be output from at least the two speakers based on the gain of the virtual speaker; and causing the four speakers to output sounds to a listener according to a result of the gain adjustment.

\* \* \* \* \*